(12) United States Patent
Praveen et al.

(10) Patent No.: US 9,651,641 B2
(45) Date of Patent: May 16, 2017

(54) IMAGE PROCESSING APPARATUS, K-SPACE GENERATION METHOD, MAGNETIC RESONANCE IMAGE APPARATUS, AND CONTROL METHOD OF MAGNETIC RESONANCE IMAGE APPARATUS

(71) Applicants: Samsung Electronics Co., Ltd., Gyeonggi-do (KR); Beth Israel Deaconess Medical Center, Inc., Boston, MA (US)

(72) Inventors: Gulaka Praveen, Gyeonggi-do (KR); Mehmet Akcakaya, Cambridge, MA (US); Reza Nezafat, Newton, MA (US)

(73) Assignees: Samsung Electronics Co., Ltd., Yeongtong-gu, Suwon-si, Gyeonggi-do (KR); Beth Israel Deaconess Medical Center, Inc. (BIDMC, INC.), Boston, MA (US)

( * ) Notice: Subject to any disclaimer, the term of this patent is extended or adjusted under 35 U.S.C. 154(b) by 668 days.

(21) Appl. No.: 14/102,637

(22) Filed: Dec. 11, 2013

(65) Prior Publication Data

US 2014/0159724 A1   Jun. 12, 2014

Related U.S. Application Data

(60) Provisional application No. 61/735,674, filed on Dec. 11, 2012.

(30) Foreign Application Priority Data

Mar. 11, 2013 (KR) .................. 10-2013-0025810

(51) Int. Cl.
*G01R 33/54* (2006.01)
*G01R 33/567* (2006.01)

(52) U.S. Cl.
CPC ......... *G01R 33/54* (2013.01); *G01R 33/5676* (2013.01)

(58) Field of Classification Search
CPC .......................... G01R 33/54; G01R 33/5676
See application file for complete search history.

(56) References Cited

U.S. PATENT DOCUMENTS

| 2011/0175609 A1* | 7/2011 | Hu ..................... G01R 33/3415 324/309 |
| 2013/0121550 A1 | 5/2013 | Chang et al. |

(Continued)

FOREIGN PATENT DOCUMENTS

| JP | 2004-321531 A | 11/2004 |
| JP | 2006-304818 A | 11/2006 |
| KR | 10-2007-0038929 A | 4/2007 |

OTHER PUBLICATIONS

Sachs et al., "Real-Time Motion Detection in Spiral MRI Using Navigators", Jul. 28, 1994, Williams & Wilkins.

(Continued)

*Primary Examiner* — Rodney Bonnette
(74) *Attorney, Agent, or Firm* — Cha & Reiter, LLC

(57) ABSTRACT

A magnetic resonance (MR) image processing system includes a data collection unit that acquires image data from a target region of an object. A navigator unit acquires a motion signal indicating motion comprising motion of at least a portion of an object. A data processing unit derives k-space data for a k-space data array from the acquired image data, by acquiring k-space data for a first portion of the k-space from the acquired image data in response to the motion signal indicating motion is within a predetermined range and acquiring k-space data for a second portion of the k-space from the acquired image data irrespective of the predetermined range.

30 Claims, 27 Drawing Sheets

(56) References Cited

U.S. PATENT DOCUMENTS

| | | | | |
|---|---|---|---|---|
| 2013/0342204 A1* | 12/2013 | Zhang | ............ | G01R 33/543 |
| | | | | 324/309 |
| 2015/0153434 A1* | 6/2015 | Ooshima | ............ | G01R 33/5676 |
| | | | | 324/309 |
| 2015/0238149 A1* | 8/2015 | Nitta | ............ | A61B 5/055 |
| | | | | 600/413 |

OTHER PUBLICATIONS

Weiger et al., "Motion-Adapted Gating Based on k-space Weighting for Reduction of Respiratory Motion Artifacts", Feb. 28, 1997 Williams & Wilkins.

* cited by examiner ical Field

A system concerns magnetic resonance (MR) image generation and processing.

2. Description of the Related Art

An image processing apparatus generates an image which may be easily recognized and visually confirmed by people using predetermined raw data or performs predetermined image processing to a portion or the entirety of the generated image, e.g. adjusts contrast or brightness of a portion or the entirety of the image.

The image processing apparatus may receive external image data and perform image processing on the received image. The image processing apparatus may include an image data collection unit to directly capture an image. In this case, the image processing apparatus may collect raw image data regarding the inside or outside of an object through the image data collection unit and process the collected raw image data to generate an image which a user may easily view or perform predetermined image post-processing on the generated image.

A magnetic resonance imaging (MRI) apparatus generates a processed image for a user from raw image data using a k-space. The magnetic resonance imaging acquires information regarding internal structure of an object, e.g. a human body, generates a visual image based on the acquired information, and provides the generated visual image to a user.

IMAGE PROCESSING APPARATUS, K-SPACE GENERATION METHOD, MAGNETIC RESONANCE IMAGE APPARATUS, AND CONTROL METHOD OF MAGNETIC RESONANCE IMAGE APPARATUS

CLAIM OF PRIORITY

This application claims the benefit of U.S. Provisional Patent Application No. 61/735,674 filed on Dec. 11, 2012 in the U.S. Patent and Trademark Office and Korean Patent Application No. 10-2013-0025810 filed on Mar. 11, 2013 in the Korean Intellectual Property Office, the disclosure of which is incorporated herein by reference.

BACKGROUND

1. Techn
SUMMARY

An image processing system rapidly and accurately generates a k-space comprising raw data used to generate an accurate magnetic resonance image A magnetic resonance (MR) image processing system includes a data collection unit that acquires image data from a target region of an object. A navigator unit acquires a motion signal indicating motion comprising motion of at least a portion of an object. A data processing unit derives k-space data for a k-space data array from the acquired image data, by acquiring k-space data for a first portion of the k-space from the acquired image data in response to the motion signal indicating motion is within a predetermined range and acquiring k-space data for a second portion of the k-space from the acquired image data irrespective of the predetermined range.

In a feature, in response to the motion signal indicating motion is outside the predetermined range, the data processing unit stops deriving the k-space data for a portion of the k-space from the image data. In response to the data processing unit stopping acquiring the k-space data, the data collection unit re-acquires image data for deriving the k-space data. The predetermined range corresponds to a motion range of the at least a portion of the object and the object comprises patient anatomy. The motion of at least a portion of the object is repetitive motion and the navigator unit tracks the repetitive motion to derive an upper limit and a lower limit of the repetitive motion. A portion of the k-space is a central area of the k-space.

In another feature, a magnetic resonance (MR) image processing system k-space generation method comprises acquiring image data from a target region of an object and acquiring a motion signal indicating motion comprising motion of at least a portion of the object. K-space data is derived for a k-space data array from the acquired image data by, in response to determining whether the motion is within a k-space data acquisition range, acquiring the k-space data for a first portion of the k-space from the image data and acquiring the k-space data for a second portion of the k-space from the image data irrespective of the k-space data acquisition range. The method excludes acquiring the k-space data for a portion of the k-space in response to the motion of at least a portion of the object deviating from the k-space data acquisition range and re-collects image data for the object in response to the motion deviating from the k-space data acquisition range. The motion of at least a portion of the object concerns a motion range of the object and is repetitive motion and the acquiring the image data comprises tracking the repetitive motion of the object to acquire an upper limit and a lower limit of the repetitive motion. A portion of the k-space is a central area of the k-space and the object comprises patient anatomy.

In a further feature, a magnetic resonance imaging system includes an imaging unit to generate a static magnetic field and a gradient magnetic field to apply to an object, to generate an electromagnetic wave to apply to a target region of the object, and to acquire a magnetic resonance signal generated from the target region in the object in response to application of the electromagnetic wave to acquire image data. A navigator unit acquires a motion signal indicating motion comprising motion of at least a portion of an object. An image generation unit derives k-space data for a k-space data array from the acquired magnetic resonance signal and generates a magnetic resonance image based on the magnetic resonance signal, by acquiring k-space data for a first portion of the k-space from the acquired image data in response to the motion signal indicating motion is within a predetermined range and acquiring k-space data for a second portion of the k-space from the acquired image data irrespective of the predetermined range.

In yet another feature, in response to the motion of at least a portion of an object deviating from the predetermined range, the image generation unit stops acquiring the k-space data from the magnetic resonance signal and in response to stopping acquiring the k-space data from the magnetic resonance signal, the imaging unit re-acquires a magnetic resonance signal. The motion signal indicates a motion range of the object and the motion of the at least a portion of an object is repetitive motion and the navigator unit tracks the repetitive motion to derive an upper limit and a lower limit of the repetitive motion. Also a portion of the k-space is a central area of the k-space and the object comprises patient anatomy and the motion of the object is respiratory motion. Further, the navigator unit comprises a respiratory navigator and the image generation unit determines whether the motion of at least a portion of an object is within the k-space data acquisition range using a gating window.

In an additional feature, a control method of a magnetic resonance imaging system comprises generating a static magnetic field and a gradient magnetic field to apply to an object. The method applies a radio frequency (RF) electromagnetic wave to a target region of the object exposed to the static magnetic field and the gradient magnetic field, receives a magnetic resonance signal generated from the target region of the object in response to the radio frequency (RF) electromagnetic wave, and tracks motion of at least a portion of the object and provides a motion signal indicating motion comprising motion of at least a portion of the object. The method derives a first portion of a k-space data from the magnetic resonance signal in response to the motion signal indicating motion being within a k-space data acquisition range and derives k-space data for a second portion of the k-space from the acquired image data irrespective of the k-space data acquisition range. In response to determining whether the magnetic resonance signal corresponds to a predetermined portion of the k-space, the method determines whether the motion of at least a portion of the object is within the k-space data acquisition range and in response to determining that the motion of at least a portion of the object is within the k-space data acquisition range, the method derives k-space data for the predetermined portion of the k-space from the magnetic resonance signal.

In yet a further feature, the method includes re-applying an electromagnetic wave to the object exposed to the static magnetic field and the gradient magnetic field and re-receiving a magnetic resonance signal generated from the object in response to the motion of at least a portion of the object deviating from the k-space data acquisition range. The determining whether the magnetic resonance signal corresponds to the predetermined portion of the k-space comprises determining whether the motion information is within the k-space data acquisition range using a gating window. The method also includes determining whether the magnetic resonance signal corresponds to a predetermined portion of the k-space and upon determining that the magnetic resonance signal corresponds to another portion of the k-space different from the predetermined portion of the k-space, acquiring k-space data for another portion of the k-space from the magnetic resonance signal.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
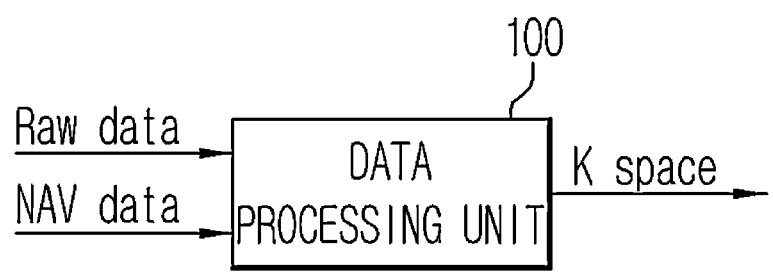
FIG. 1 shows a data processing unit of an image processing apparatus according to invention principles.

Reference will now be made in detail to the embodiments of the present invention, examples of which are illustrated in the accompanying drawings, wherein like reference numerals refer to like elements throughout.

Hereinafter, an embodiment of an image processing apparatus is described with reference to FIGS. 1 to 11.

FIG. 1 shows a data processing unit 100 of an image processing apparatus that receives collected raw data, acquires k-space data from the raw data, fills a k-space using the acquired k-space data to generate the k-space, and outputs the k-space. The data processing unit 100 may divide the k-space into a plurality of areas and perform different processes in the respective areas on the acquired k-space data to provide k-space for output. For example, in a case in which the data processing unit 100 selects and acquires k-space data from a plurality of areas, k-space data may be selected and acquired on the premise that at least one of the areas satisfies a predetermined condition. In this case, the data processing unit 100 may further acquire additional information and select and acquire k-space data depending upon whether the additionally acquired information satisfies a predetermined condition or an additionally calculated condition. The additionally acquired information may be information regarding motion of a motion region, i.e. motion information (NAV data). As shown in FIG. 1, the data processing unit 100 may further receive the motion information regarding the motion region independent of the raw data and select k-space data based on the received motion information to generate a k-space.

The data processing unit 100 may divide the k-space into the plurality of areas and collect k-space data for the k-space from the respective areas according to a predetermined condition or unconditionally. For example, it is assumed that the k-space may be divided into two areas. Such division may be predetermined, selected by a user during operation of the data processing unit 100, or determined according to additionally input data or external environmental variables. Consequently, the data processing unit 100 may select and acquire k-space data from the two divided areas using different methods. For example, the data processing unit 100 may acquire k-space data from one area of the k-space on the premise that a first predetermined condition is satisfied and collect k-space data from the other area of the k-space on the premise of a different second predetermined condition is satisfied or no condition is satisfied. The collected k-space data may be combined to generate one k-space.

In order to acquire k-space data in divided areas of the k-space, the data processing unit 100 may acquire the k-space data from the respective areas of the k-space at the same time or at different times. In addition, the data processing unit 100 may sequentially acquire the k-space data from the respective areas in predetermined order. For example, where the k-space is divided into a first area and a second area, the data processing unit 100 may further include a first processing unit and a second processing unit to extract k-space data from the first area and the second area. The first processing unit and the second processing unit may acquire the k-space data at the same time or at different times. The first processing unit may extract the k-space data from the first area and subsequently the second processing unit may extract the k-space data from the second area.

Figure 2:
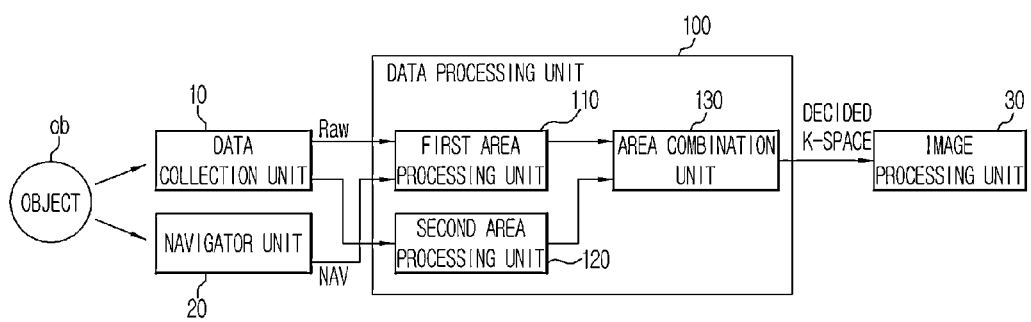
FIG. 2 shows an image processing apparatus according to invention principles.
Figure 3:
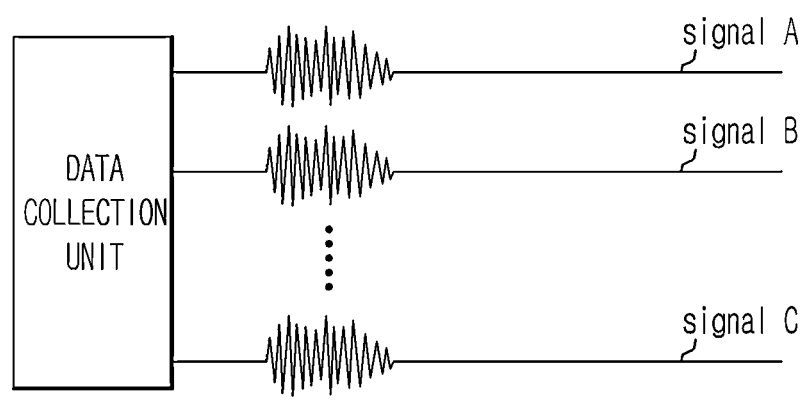
FIG. 3 shows a data collection unit according to invention principles.

An image processing apparatus including the data processing unit 100 is shown in FIG. 2. The image processing apparatus may include a data collection unit 10, a navigator unit 20, the data processing unit 100, and an image processing unit 30. The data collection unit 10 collects information regarding a target region outside or inside an object ob. FIG. 3 shows the data collection unit. The data collection unit 10 collects a signal generated from the target region to collect information regarding the target region and outputs the collected information, i.e. the signal, in the form of raw data after amplifying the collected information or performing analog/digital conversion to the collected information. The data collection unit 10 may output a plurality of signals (signal A to signal C). The output signals are transmitted to the data processing unit 100 as shown in FIG. 2.

Figure 4:
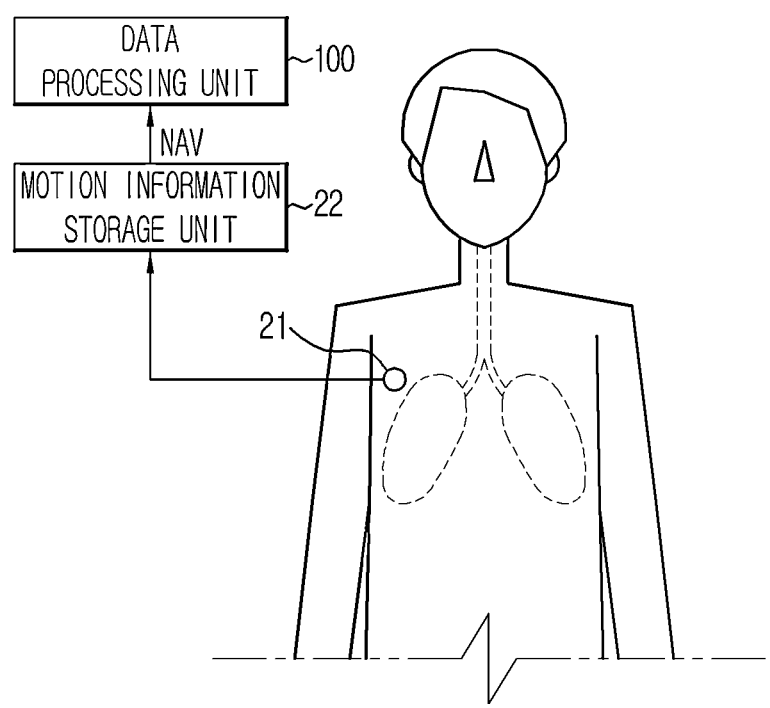
FIG. 4 shows a navigator unit according to invention principles.

The data collection unit 10 may be a magnetic field forming coil and a radio frequency (RF) coil to collect slice information of the interior of an object, such as a human body, from the object in a bore of a magnetic resonance image apparatus. The data collection unit 10 may collect a magnetic resonance signal and output the collected magnetic resonance signal. The output magnetic resonance signal may be amplified and may be output in the form of raw data without additional processing. The navigator unit 20 tracks motion of a motion region of the object ob to collect motion information (NAV data) regarding motion of the object ob. In this case, the object having the tracked motion region may be identical to or different from the object having the target region. FIG. 4 shows the navigator unit 20 including a sensor unit 21 and a motion information storage unit 22.

The sensor unit 21 senses motion of the object ob, specifically motion of the motion region of the object ob. For example, in a case in which the object ob is a human body, the sensor unit 21 senses and tracks motion of the motion region of the object ob, for example motion of a chest of the human body, such as respiration of the human body, or pulsation of a heart in the human body. The motion region may be identical to or different from the target region. In an example, the target region and the motion region may be a chest including a lung. In another example, the target region may be a heart and internal organs, whereas the motion region may be a lung, a liver, and a diaphragm. This may be determined according to user selection or predetermined setting. In addition, the motion region and the target region may be tissue or structure of the same object ob. For example, the motion region may be the diaphragm of one human body and organs and the target region may be various internal organs, such as the heart and the lung, of the same human body. As needed, the motion region and the target region may be tissue or structure of different objects ob.

The sensor unit 21 senses and tracks motion of the motion region to output a signal, i.e. motion information (NAV data), corresponding to the motion of the object ob. The output motion information may be information regarding a motion range of the motion region, for example the upper limit and the lower limit of motion of the chest during respiration. Specifically, in a case in which motion of the motion region is respiration, i.e. repetitive motion including inhalation and exhalation, the sensor unit 21 may track the repetitive motion of the object ob to collect information regarding the upper limit and the lower limit of the repetitive motion of the object and output the collected information as motion information (NAV data). The motion information (NAV data) output from the sensor unit 21 may be raw data. Although not shown, therefore, the navigator unit 20 may further include a motion information processing unit to process the motion information output from the sensor unit 21 to generate processed data, such as image data enabling to visually identify the motion.

The motion information storage unit 22 temporarily and continuously stores the motion information output from the sensor 21 or the motion information processing unit (within unit 22) according to the motion of the motion region. The motion information storage unit 22 transmits the stored motion information (NAV data) to the data processing unit 100. The image processing apparatus is a magnetic resonance imaging apparatus, the navigator unit 20 may be a respiratory navigator. The respiratory navigator tracks respiration using at least one navigation echo output according to motion of the chest due to external respiration. Motion information output from the respiratory navigator may be imaged as shown in FIG. 5 and output in a form intuitively recognizable by a user.

Figure 5:
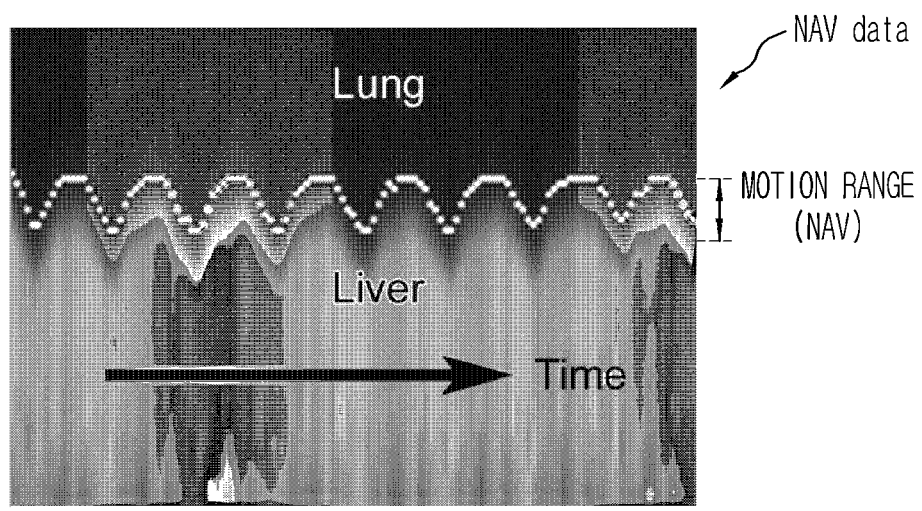
FIG. 5 shows motion information output in an image from the navigator unit according to invention principles.

FIG. 5 shows a motion information output from the navigator unit comprising an image acquired using coronary artery MR imaging of a chest using respiratory gating. The dark portion of the upper end of the image indicates a lung and the bright portion of the lower end of the image indicates a liver. Time advances from the left side to the right side of the image. A wave motion form is present at an interface between the lung and the liver. In this case, upwardly convex portions of the image indicate shrinkage of the lung, i.e. exhalation, and the downwardly concave portions of the image indicate expansion of the lung, i.e. inhalation. The wave motion form is present at the interface between the lung and the liver due to change in size of the lung and liver according to respiration or motion of the diaphragm between the lung and liver. Consequently, motion of the diaphragm, i.e. respiration, may be tracked and confirmed from coronary artery MR images acquired by a plurality of navigation echoes output over time.

As shown in FIG. 2, the data processing unit 100 receives data from the data collection unit 10 and the navigator unit 20, acquires k-space data using the received data, and transmits the acquired k-space data, i.e. the k-space, to the image processing unit 30. Specifically, the data processing unit 100 receives raw data from unit 10 used to generate a k-space data array for generating an image, and receives motion information regarding motion of the motion region, such as respiration, i.e. repetitive motion of the diaphragm, from the navigator unit 20. The data processing unit 100 may include a first area processing unit 110, a second area processing unit 120, and an area combination unit 130 as shown in FIG. 2. As described above, the data processing unit 100 may collect k-space data from areas of a k-space to be generated.

Figure 6:
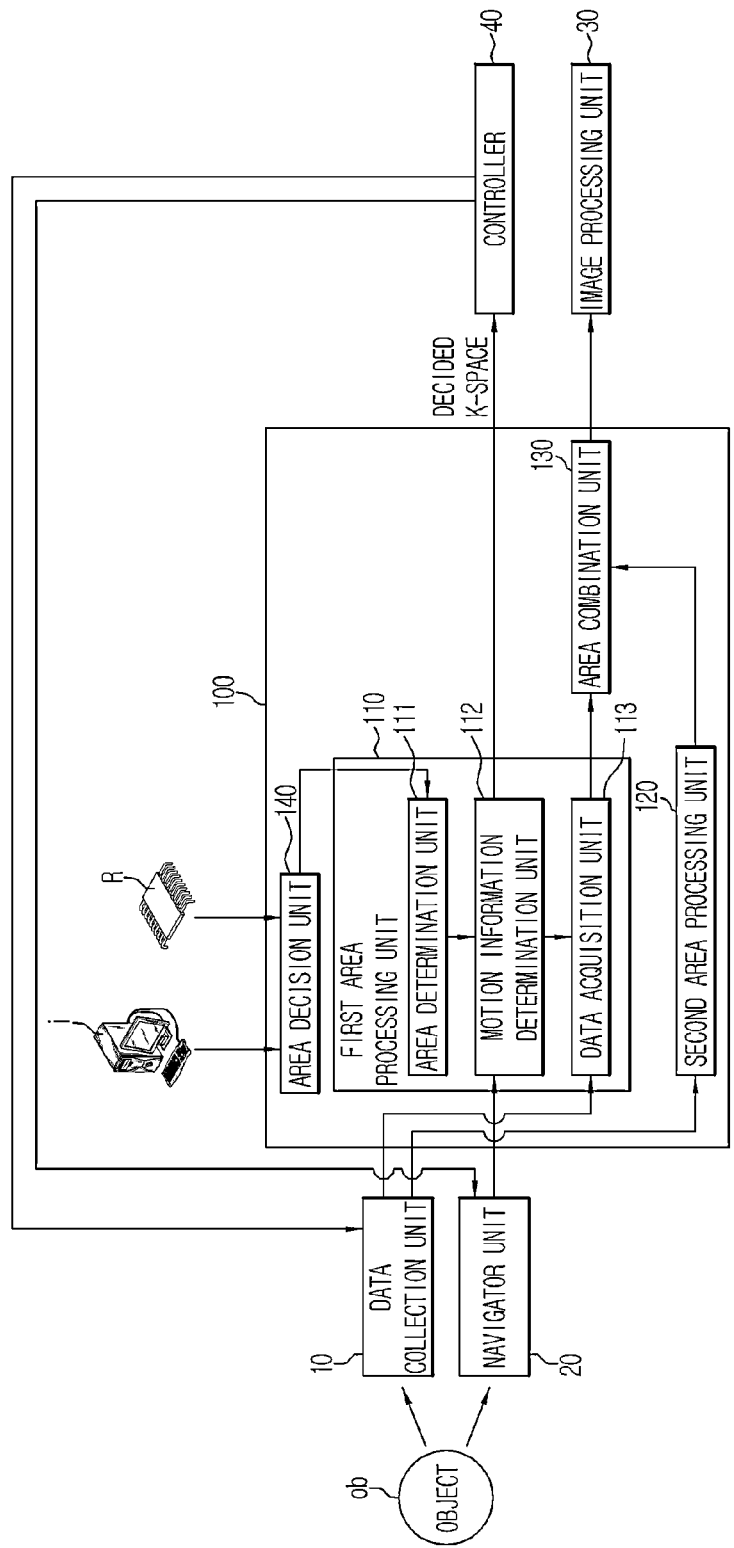
FIG. 6 shows the image processing apparatus in detail according to invention principles.

FIG. 6 shows the image processing apparatus and FIGS. 2 and 6 show the image processing apparatus in a case in which the data processing unit 100 divides a k-space into two areas, i.e. a first area and a second area, and separately acquires k-space data from the respective areas, i.e. the first area and the second area, to generate the k-space. The data processing unit 100 may include a first area processing unit 110, a second area processing unit 120, and an area combination unit 130. The first area processing unit 110 and the second area processing unit 120 acquire k-space data corresponding to different areas of the k-space from raw data. In addition, the first area processing unit 110 and the second area processing unit 120 may acquire k-space data according to different conditions or different methods.

Figure 7:
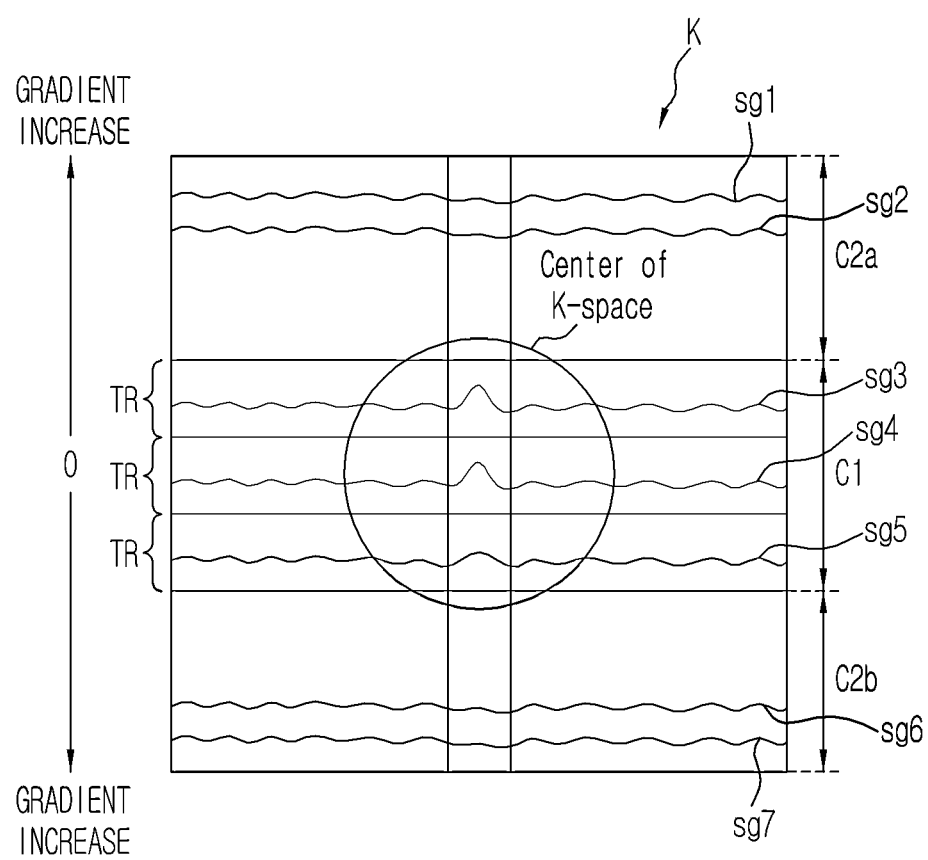
FIG. 7 shows a k-space according to invention principles.

FIG. 7 shows a data space expressed as a matrix and acquired based on raw data sg1 to sg7 of the magnetic resonance imaging apparatus. The data space may comprise a k-space data array matrix of 256×256. The middle row of the matrix of the data space corresponds to a signal acquired in a state in which a phase-encoding gradient is the minimum. Rows of the matrix arranged from the middle to the edges of the data space correspond to signals acquired while the phase-encoding gradient is gradually increased. The data space may be divided into a plurality of areas, for example a set of a plurality of rows located at the central portion of the data space, comprises a first data area c1, and the remaining portion of the data space corresponding to the k-space, for example a set of the remaining rows excluding the rows located at the central portion of the data space, comprises a second data area c2a and c2b. The set of rows located at the central portion of the data space may include a center of the data space. The central area of the data space corresponds to a central area of the k-space.

The first area processing unit 110 acquires k-space data corresponding to the first area of the k-space from raw data sg3 to sg5 corresponding to the first area of the k-space. In other words, the first area processing unit 110 acquires k-space data to fill the first area of the k-space from the first data area c1 of the k-space shown in FIG. 7. The second area processing unit 120 acquires k-space data corresponding to the second area of the k-space from raw data sg1, sg2, sg6, and sg7 corresponding to the second area of the k-space. The second area processing unit 120 acquires k-space data to fill the second area of the k-space from the second data area c2 (C2a and C2b) of the k-space shown in FIG. 7.

The first area processing unit 110 of the data processing unit 100 may acquire k-space data corresponding to the first area of the k-space from raw data in a case in which a predetermined condition is satisfied. The predetermined condition may be a condition based on motion information (NAV signal) output, for example, from the navigator unit 20. Specifically, as shown in FIGS. 2 and 6, the first area processing unit 110 may receive raw data from the data collection unit 10 and motion information from the navigator unit 20. The first area processing unit 110 determines whether to acquire k-space data based on the motion information received from the navigator unit 20 and acquires k-space data from the raw data resulting response to the determination. The first area processing unit 110 may include an area determination unit 111, a motion information determination unit 112, and a data acquisition unit 113.

The area determination unit 111 determines whether the raw data received from the data collection unit 10 is data for an area of the k-space to be processed by the first area processing unit 110, e.g. the first area of the k-space. The area of the k-space may be predetermined, selected by a user, or calculated based on additional information, such as raw data or motion information.

When the area determination unit 111 determines that the raw data received from the data collection unit 10 are signals corresponding to an area of the k-space to be processed by the first area processing unit 110, e.g. the first area of the k-space, the motion information determination unit 112 determines whether to acquire data based on the motion information received from the navigator unit 20. For example, where the object ob is a human body, the motion information determination unit 112 may determine whether to acquire k-space data in response to respiration of the human body. Where the chest is excessively expanded due to respiration of the human body when acquiring an image, the acquired image may be erroneous. In this case, therefore, the motion information determination unit 112 may determine not to acquire k-space data such that the first area processing unit 110 does not acquire the k-space data. The motion information determination unit 112 determines not to acquire k-space data in a case in which motion information, such as a motion range, of the motion region is out of a predetermined range. Also, the motion information determination unit 112 determines to acquire k-space data in a case in which the motion information, such as the motion range, of the motion region is within the predetermined range.

Figure 8:
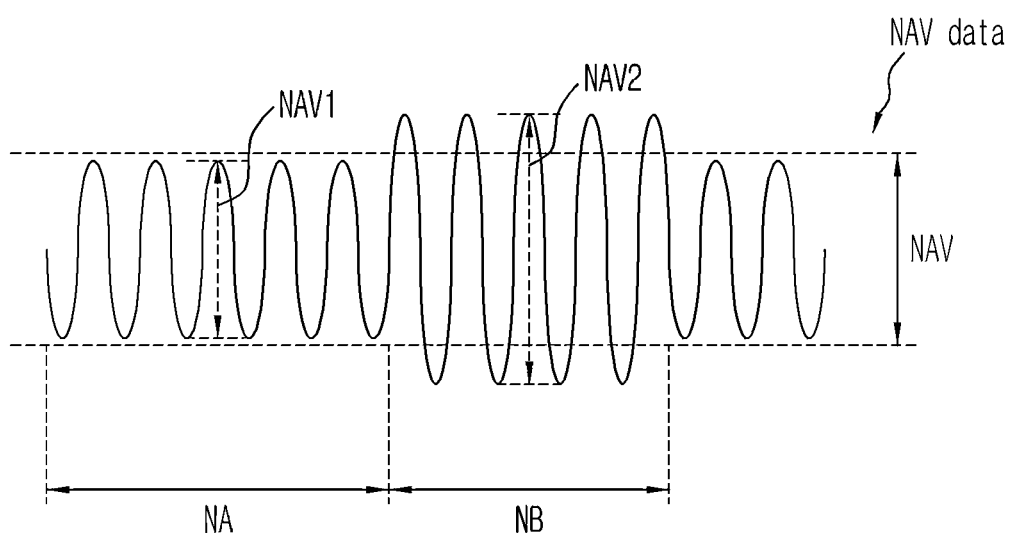
FIG. 8 shows motion information output from the navigator unit according to invention principles.

FIG. 8 shows motion information output from the navigator unit 20. Motion information output from the navigator unit 20 is transmitted to the motion information determination unit 112. The motion information determination unit 112 may compare input motion information signals NAV1 and NAV2 with a predetermined k-space data acquisition range NAV and determine whether the first area processing unit 110 acquires a signal input to the first data area c1 to generate the k-space based on a comparison result. Specifically, where the motion information does not deviate from the k-space data acquisition range as shown in the left side NA of FIG. 8 (NAV1), the motion information determination unit 112 may determine to acquire k-space data based on the motion information, extract a signal from input raw data to generate a control signal to acquire k-space data to generate the k-space, and transmit the control signal to the data acquisition unit 113.

Where the motion information deviates from the k-space data acquisition range as shown in the right side NB of FIG. 8 (NAV2), the motion information determination unit 112 may determine not to acquire k-space data based on the motion information, generate a control signal not to extract a signal from input raw data, i.e. a control signal not to acquire k-space data, and transmit the control signal to the data acquisition unit 113. Where the motion information deviates from the k-space data acquisition range (NAV2) and the motion information determination unit 112 determines not to acquire k-space data based on the motion information, the motion information determination unit 112 may generate additional information regarding a determination result or a control signal based on the determination result and transmit the information or the control signal to the controller 40.

Upon receiving the information or the control signal from the motion information determination unit 112, the controller 40 generates an additional control signal for the data collection unit 10 or the navigator unit 20 and transmits the generated control signal to the data collection unit 10 or the navigator unit 20. The data collection unit 10 collects raw data from the target region according to the control signal received from the controller 40 and transmits the collected data to the first area processing unit 110 or the second area processing unit 120 of the data processing unit 100. The data collection unit 10 may continuously collect raw data from the target region without an additional control signal. In addition, the navigator unit 20 collects motion information from the motion region according to the control signal received from the controller 40 and transmits the collected motion information to the first area processing unit 110 of the data processing unit 100. The navigator unit 20 may continuously collect motion information from the motion region without an additional control signal. In this case, the navigator unit 20 continuously performs a motion information collection operation irrespective of a control signal.

The first area processing unit 110 acquires or does not acquire k-space data for the first area of the k-space based on the raw data and the motion information received from the data collection unit 10 and the navigator unit 20. The data acquisition unit 113 acquires or does not acquire k-space data according to the control signal received from the motion information determination unit 112. For example, when the motion information determination unit 112 determines that the motion information is within a predetermined data acquisition range, generates a control signal to acquire k-space data from the raw data, and transmits the generated control signal to the data acquisition unit 113, the data acquisition unit 113 stores data of the first data area c1 to acquire k-space data for the first area of the k-space.

When the motion information determination unit 112 determines that the motion information is out of the predetermined data acquisition range, unit 112 transmits a control signal not to acquire k-space data to the data acquisition unit 113, the data acquisition unit 113 does not extract or store data of the first data area c1. As a result, the data acquisition unit 113 does not acquire k-space data for the first area of the k-space from the raw data. The data of the first data area c1 is discarded. The second area processing unit 120 acquires k-space data using a method different from the method used in the first area processing unit 110.

Figure 9:
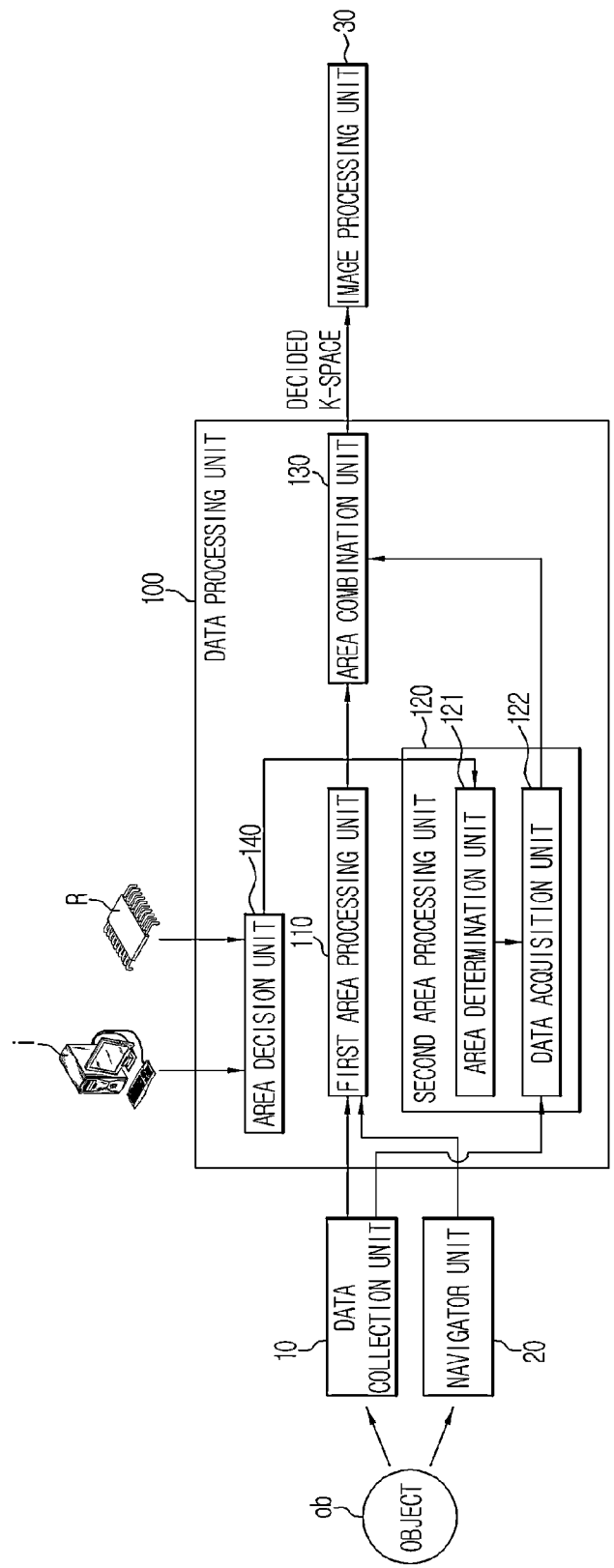
FIG. 9 shows an image processing apparatus in detail according to invention principles.

FIG. 9 shows the image processing apparatus including the second area processing unit 120 also including an area determination unit 121 and a data acquisition unit 122. The area determination unit 121 of the second area processing unit 120 determines whether the raw data received from the data collection unit 10 is data for an area of the k-space to be processed by the second area processing unit 120, e.g. the second area of the k-space. In the same manner as in the first area of the k-space, the second area of the k-space may be predetermined, selected by a user, or determined based on additional information, such as raw data or motion information. When the area determination unit 121 determines that the raw data received from the data collection unit 10 is data to be processed by the second area processing unit 120, the data acquisition unit 122 stores the raw data to acquire k-space data for the second area of the k-space.

Unlike the first area processing unit 110, the second area processing unit 120 does not determine whether additional motion information is included in the k-space data acquisition range and unconditionally acquires k-space data. Although not shown, the data processing unit 100 may further include an area division unit to sort a data signal corresponding to the first area processed by the first area processing unit 110 and a data signal corresponding to the second area to be processed by the second area processing unit 120 before the first area processing unit 110 and the second area processing unit 120 acquire k-space data. The area division unit sorts data input from the data collection unit 10 and transmits the sorted data to the first area processing unit 110 or the second area processing unit 120.

Specifically, when an area decision unit 140 determines areas of the k-space to be processed by the first area processing unit 110 and the second area processing unit 120 according to a user command input through a manipulation unit or pre-stored setting information, the area division unit sorts raw data corresponding to the first area of the k-space and raw data corresponding to the second area of the k-space from raw data input from the data collection unit and transmits the sorted raw data to the first area processing unit 110 and the second area processing unit 120. The area division unit determines whether the raw data corresponds to the first area of the k-space and if so, transmits the raw data to the first area processing unit 110. Upon determining that the raw data does not correspond to the first area of the k-space, the area division unit determines whether the raw data correspond to the second area of the k-space and if so, transmits the raw data to the second area processing unit 120. The area combination unit 130 of the data processing unit 100 combines the k-space data for the first area acquired by the first area processing unit 110 and the k-space data for the second area acquired by the second area processing unit 120 to form an overall k-space.

Figure 10:
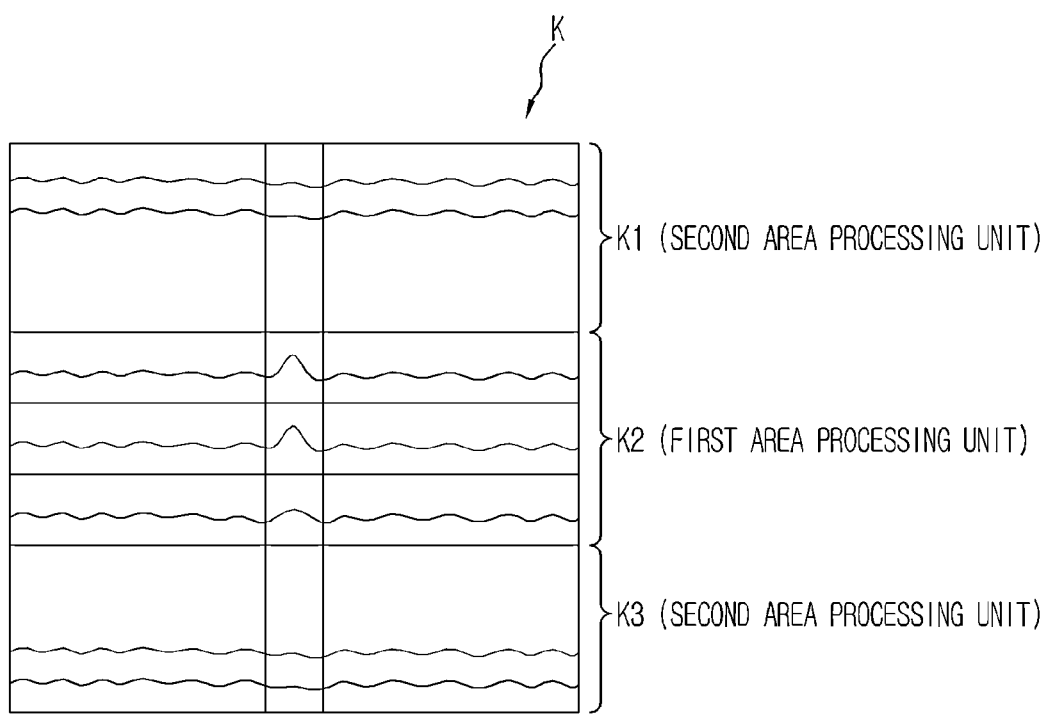
FIG. 10 shows a k-space acquired based on k-space data collected from a first area and a second area according to invention principles.
Figure 11:
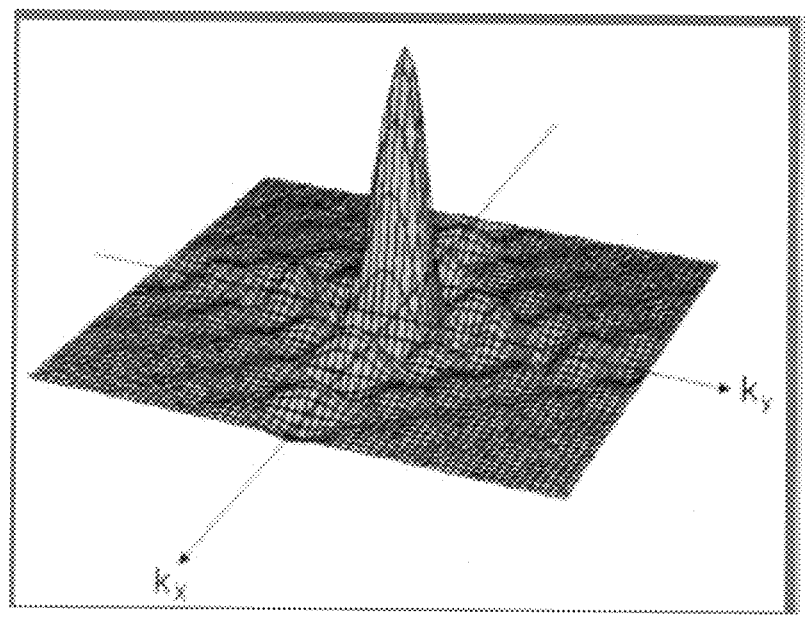
FIG. 11 shows an example of the k-space according to invention principles.

FIG. 10 shows a k-space generated based on the k-space data collected from the first area and the second area and FIG. 11 shows a three-dimensional view of the k-space. Referring to FIG. 10, the finally generated k space K may be divided into three areas, i.e. a first area to a third area K1 to K3. The first area K1 and the third area K3 of the k-space K are filled with the k-space data acquired by the second area processing unit 120. The second area K2 is filled with the k-space data acquired by the first area processing unit 110. As a result, the k-space as shown in FIG. 11 is generated. The generated k-space is used for image generation and is transmitted to the image processing unit 30 as shown in FIGS. 2, 6, and 9.

The data processing unit 100 may further include an area decision unit 140 (FIG. 9) to determine areas, such as the first area and the second area, of the k-space. The area decision unit 140 may receive information regarding areas of the k-space to be processed by the respective area processing units 110 and 120 through an additional external workstation. Alternatively, the area decision unit 140 may read information regarding areas of the k-space from an additional memory device R to determine the areas of the k-space. Specifically, the information regarding the areas of the k-space may include information, such as the number of areas, the size of each area, and position of each area.

The first area processing unit 110 and the second area processing unit 120 may further include the area determination units 111 and 121, respectively. The area decision unit 140 determines areas, e.g. the first area and the second area, of the k-space and transmits decision information to the area determination unit 111 of the first area processing unit 110 or the area determination unit 121 of the second area processing unit 120. The area determination unit 111 of the first area processing unit 110 or the area determination unit 121 of the second area processing unit 120 determines whether the input raw data corresponds to the area, e.g. the first area K2 or the second area K1 and K3, processed by the first area processing unit 110 or the second area processing unit 120 based on the information regarding the area of the k-space received from the area decision unit 140 and acquires k-space data for the first area K2 or the second area K1 and K3 of the k-space in response to a determination result.

The image processing unit 30 shown in FIGS. 2, 6, and 9 generates a predetermined image based on the k-space received from the data processing unit 100. The image processing unit 30 may perform Fourier transform to the received k-space to generate a magnetic resonance image. Although the k-space is divided into two areas, the k-space may be divided into more than two areas. In this case, the data processing unit 100 may further include a third area processing unit or a fourth area processing unit. The image processing apparatus as described above may be applied to various imaging systems. For example, the image processing apparatus may be applied to a magnetic resonance imaging apparatus.

Figure 12:
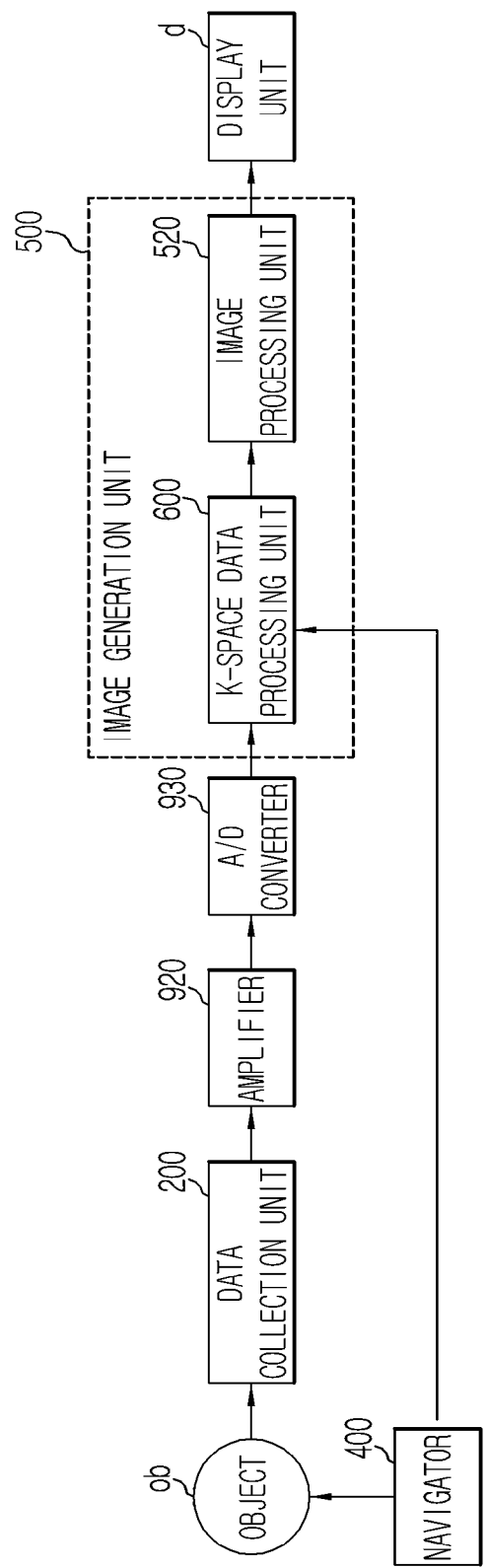
FIG. 12 shows a magnetic resonance imaging apparatus according to invention principles.

A magnetic resonance imaging apparatus is described with reference to FIGS. 12 to 23. FIG. 12 shows a magnetic resonance imaging apparatus including a data collection unit 200, an amplifier 920, an analog/digital (A/D) converter 930, an image generation unit 500, a navigator 400, and a display unit d. The data collection unit 200 collects a magnetic resonance signal such as analog signal, from a target region in an object ob to generate a magnetic resonance image. The amplifier 920 amplifies the collected magnetic resonance signal and transmits the amplified magnetic resonance signal to the A/D converter 930. The A/D converter 930 converts the amplified analog magnetic resonance signal into a digital signal. The digitized signal is transmitted to the image generation unit 500. The image generation unit 500 generates a k-space data array from the digitized magnetic resonance signal using a k-space data processing unit 600 and an image processing unit 520 and performs Fourier transform on the k-space data to generate a magnetic resonance image.

The k-space data processing unit 600 generates a k-space data array based on the digitized magnetic resonance signal. The k-space data processing unit 600 may acquire k-space data for a portion of the k-space and k-space data for another portion of the k-space using different methods. The k-space data processing unit 600 may further receive motion information regarding motion of a motion region of the object ob from the navigator 400. The k-space data processing unit 600 may acquire k-space data for a portion of the k-space based on the received motion information. In addition, the k-space data processing unit 600 may acquire k-space data for another portion of the k-space irrespective of the motion information.

Figure 13:
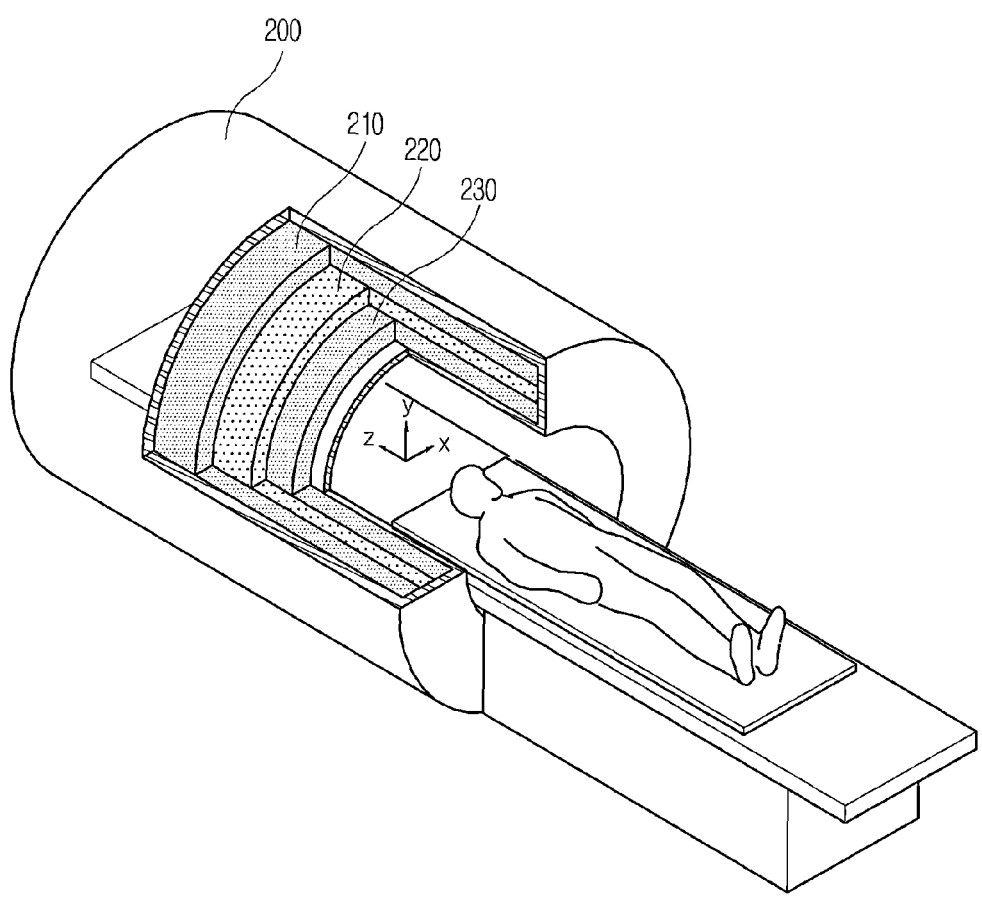
FIG. 13 shows a magnetic resonance imaging system according to invention principles.
Figure 14:
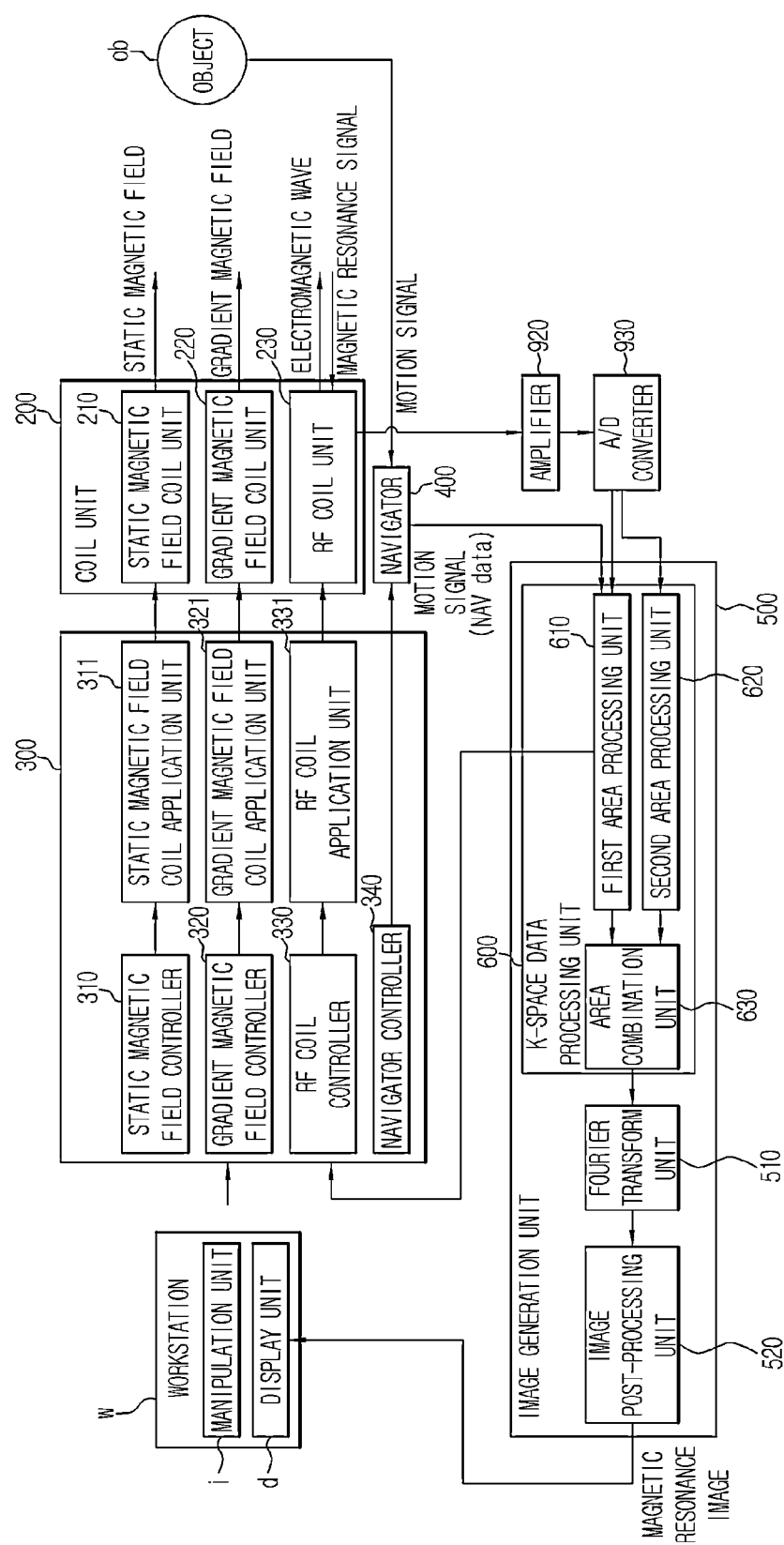
FIG. 14 shows a magnetic resonance imaging apparatus in detail according to invention principles.

The image processing unit 520 of the image generation unit 500 performs a Fourier transform on the k-space data generated by the k-space data processing unit 600 to generate a magnetic resonance image and transmits the magnetic resonance image to the display unit d under control of a central processing unit or a user. The display unit d displays the magnetic resonance image to the user. FIG. 13 shows the magnetic resonance imaging apparatus and FIG. 14 shows the magnetic resonance imaging apparatus in more detail.

As shown in FIG. 13, the magnetic resonance imaging apparatus includes a bore, which is a cylindrical body having a hollow inner space, i.e. a cavity. An object, e.g. a human body, is introduced into the cavity while being placed on a transfer unit, e.g. a transfer table. The data collection unit 200 generates a magnetic field at the object in the cavity to induce magnetic resonance excitation and receives a magnetic resonance signal generated in response to the magnetic resonance excitation to collect raw data of a slice in the object. The data collection unit 200 of the magnetic resonance imaging apparatus collects a magnetic resonance signal from the object ob in response to atomic nucleus resonance induced by an electromagnetic wave of a predetermined frequency, i.e. a nuclear magnetic resonance (NMR) phenomenon. An atomic nucleus of an element, such as hydrogen (H), phosphorus (P), sodium (Na), or each carbon isotope (C), has a spin. When the atomic nucleus is exposed to an external magnetic field, such as a static magnetic field, and thus magnetized, the spin of the atomic nucleus is aligned in a magnetic field direction and, in addition, rapidly rotates at a predetermined angle to a central axis due to torque applied by the magnetic field, i.e. performs precession. A frequency of the precession of the spin of the atomic nucleus is referred to as a Larmor frequency. The Larmor frequency may be changed depending upon intensity of the external magnetic field and type of the atomic nucleus. When an electromagnetic wave having a frequency identical or similar to the Larmor frequency is applied to an atomic nucleus, e.g. an atomic nucleus of a hydrogen atom, during precession, a magnetization vector of the atomic nucleus resonates and thus is directed in a direction perpendicular to the static magnetic field. At this time, the magnetization vector induces a voltage signal, which is generally called a free induction decay (FID) signal, in a radio frequency (RF) coil adjacent thereto. This is referred to as a NMR phenomenon.

Figure 15:
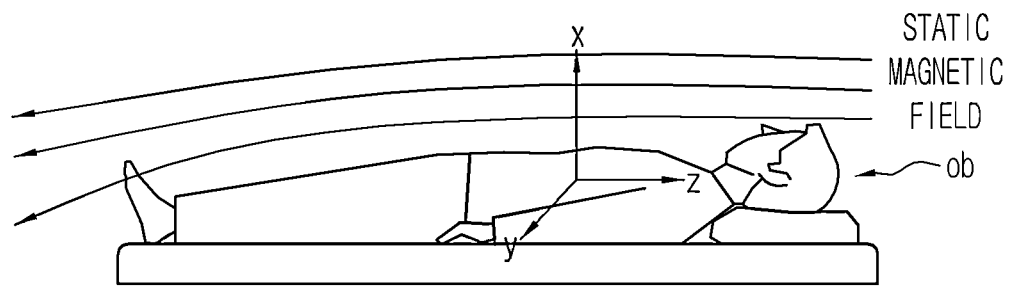
FIG. 15 shows a static magnetic field of the magnetic resonance imaging apparatus according to invention principles.

The data collection unit 200 generates an image of a target region in the object, e.g. a human body, from the induced voltage signal and provides the generated image to a user. In order to acquire a magnetic resonance signal using the NMR phenomenon as described above, as shown in FIGS. 13 and 14, the data collection unit 200 may include a plurality of coil units, i.e. a static magnetic field coil unit 210, a gradient magnetic field coil unit 220, and an RF coil unit 230. The coil units may be formed at the bore as shown in FIG. 13. FIG. 15 shows a static magnetic field of the magnetic resonance imaging apparatus generated by the static magnetic field coil unit. The static magnetic field coil unit 210 generates a static magnetic field to magnetize an atomic nucleus of an element, such as hydrogen, phosphorus, or sodium, to induce an MR phenomenon among elements present in the human body. The static magnetic field generated by the static magnetic field coil unit 210 is generally parallel to a coaxial line of the bore.

On the assumption that a component parallel to the coaxial line of the bore is a z axis, a component perpendicular to the z axis and parallel to the transfer table is an x axis, and a component perpendicular to the z axis and parallel to a normal line of the transfer table is a y axis as shown in FIG. 15, the static magnetic field is generated in the z-axis direction of FIG. 15. The object ob is a human body, the static magnetic field is generated from the head to the feet of the human body. The Larmor frequency is proportional to intensity of the static magnetic field generated in the object ob. The static magnetic field coil unit 210 is made of a superconductive electromagnet or a permanent magnet. The superconductive electromagnet is used to generate a magnetic field having a high magnetic flux density of 0.5 T. When an atomic nucleus of an element, such as hydrogen, phosphorus, or sodium, is exposed to the static magnetic field, the atomic nucleus is magnetized and a magnetization vector of the atomic nucleus performs precession about the static magnetic field.

The gradient magnetic field coil unit 220 generates spatially linear gradient magnetic fields Gx, Gy, and Gz at the object ob in the cavity to change equality of the magnetic field. When the magnetization vector of the atomic nucleus of the element, such as hydrogen, phosphorus, or sodium, generated by the primary magnetic field is rotated on a transverse plane, therefore, gradient coils 221 to 223 (FIG. 16) spatially control a rotational frequency or phase of the magnetization vector such that a magnetic resonance image signal is expressed as a spatial frequency area, i.e. a k-space.

Figure 16:
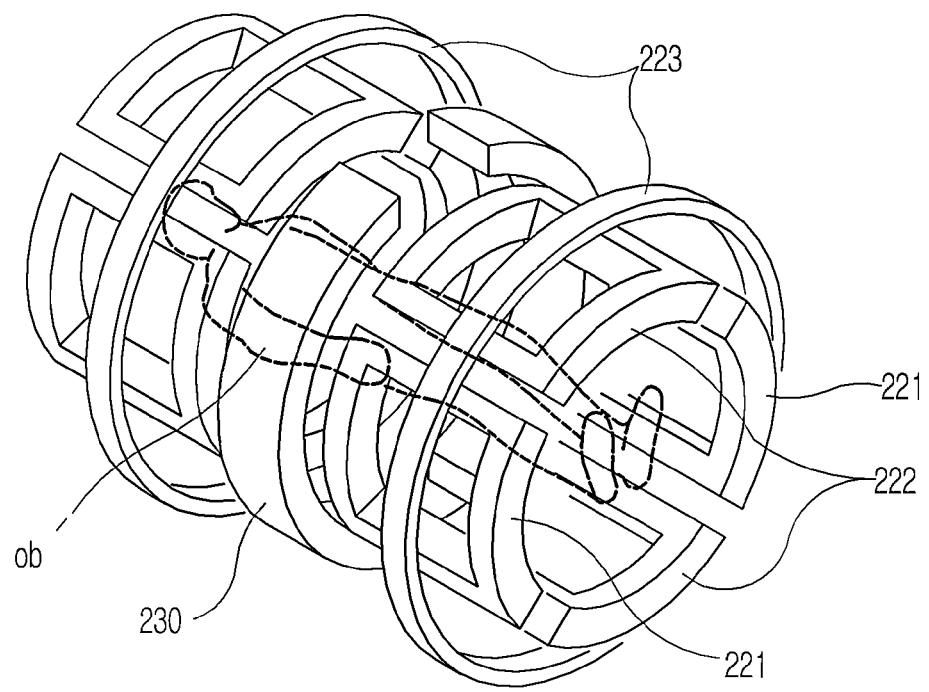
FIG. 16 shows a gradient magnetic field coil unit of the magnetic resonance imaging apparatus according to invention principles.

FIG. 16 shows the gradient magnetic field coil unit of the magnetic resonance imaging apparatus. As shown in FIG. 16, the gradient magnetic field coil unit 220 may include three kinds of gradient coils 221 to 223 to generate gradient magnetic fields in x-axis, y-axis, and z-axis directions. The respective gradient coils generate gradient magnetic fields Gx, Gy, and Gz in different directions. The z-axis gradient coils 221 generate a slice-select gradient magnetic field Gz in the z-axis direction to select a slice used in selecting a slice. The y-axis gradient coils 222 generate a phase-encoding gradient magnetic field Gy in the y-axis direction to cause a phase shift such that rows of the slice have different phases for phase encoding. The x-axis gradient coils 223 generate a frequency-encoding gradient magnetic field Gy in the x-axis direction to distinguish between spins constituting the respective rows such that the spins have different frequencies.

Figure 17:
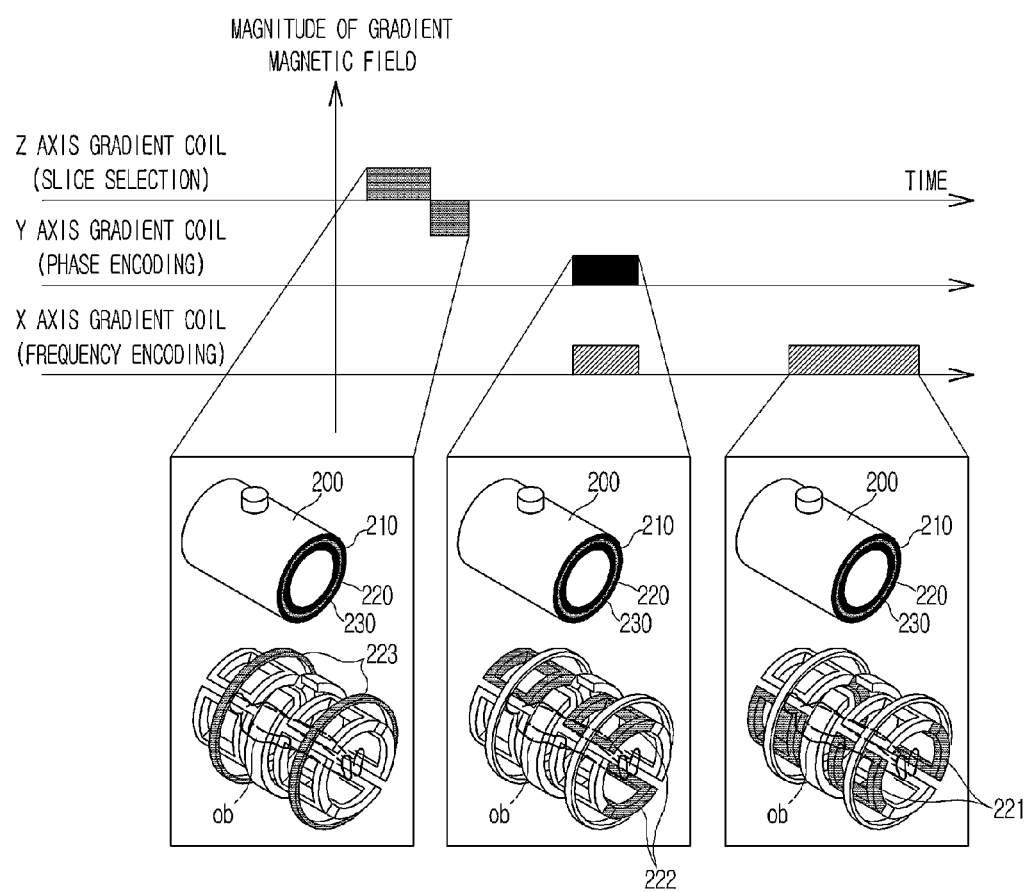
FIG. 17 shows pulse sequences of gradient coils according to invention principles.

FIG. 17 shows pulse sequences for driving the gradient coils. The z-axis gradient coils 221 generate a gradient magnetic field Gz in the z-axis direction. For example, in a case in which the object ob is a human body, intensity of a magnetic field is gradually decreased from the head to the feet of the human body to generate a magnetic field having a predetermined gradient in the z-axis direction. In this case, when the RF coil unit 230 transmits an RF pulse, a magnetic resonance signal is generated from a selected anatomical slice. Spins of protons of the selected slice have the same frequency and phase with the result that distinction between the respective spins may be ambiguous.

The y-axis gradient coils 222 generate a phase-encoding gradient magnetic field Gy in the y-axis direction. Different phase shifts are applied to spins of each slice in response to the phase-encoding gradient magnetic field. That is, when a y-axis gradient magnetic field is generated, the phase of the spins to which a high gradient magnetic field is applied is changed to correspond to a high frequency and the phase of the spins to which a low gradient magnetic field is applied is changed to correspond to a low frequency. When the y-axis gradient magnetic field is blocked, the spins process at a predetermined frequency and permanent phase change is generated due to the y-axis gradient magnetic field, thereby distinguishing between the respective spins in a phase encoding process. During acquisition of the magnetic resonance signal, the x-axis gradient coils 223 apply an x-axis frequency-encoding gradient magnetic field Gx to the object ob. In a slice expressed as a predetermined matrix, proton spins corresponding to the respective matrix rows have different frequencies enabling distinguishing between the spins. This is called frequency encoding.

In response to application of the static magnetic field and the gradient magnetic field to the object ob, the RF coil unit 230 generates a high frequency magnetic field to rotate a magnetization vector generated by the static magnetic field on a transverse plane. When high frequency current of a Larmor frequency band is applied to the RF coil unit 230, a high frequency coil of the RF coil unit 230 generates a magnetic field rotating around the coil at a Larmor frequency according to the applied high frequency current. At this time, when the rotating magnetic field resonates with the magnetization vector of the target region in the object ob, the magnetization vector of the target region rotates at the Larmor frequency in parallel to the transverse plane. At this time, electromotive force is induced in the high frequency coil of the RF coil unit 230 according to the rotation of the magnetization vector. A sine wave of the Larmor frequency is demodulated based on the induced electromotive force signal to acquire a magnetic resonance signal of a baseband, thereby a magnetic resonance signal is acquired for the target region inside or outside the object ob. The RF coil unit 230 may use a series of high frequency coils to generate a rotating magnetic field and to receive a magnetic resonance signal. Alternatively, the RF coil unit 230 may include a high frequency coil to generate rotating magnetic field and another high frequency coil to receive a magnetic resonance signal.

Referring to FIGS. 12 and 14, the magnetic resonance imaging apparatus may include a navigator 400 that tracks motion of the object ob, specifically motion of the motion region of the object ob. The navigator 400 may be a respiratory navigator to detect and track respiration of the human body using at least one navigation echo output in response to the respiration of the human body and output motion information, such as a navigator echo, as shown in FIG. 5. For example, as shown in FIG. 5, the diaphragm between the lung and liver in the chest may shrink or expand within a predetermined motion range. The navigator 400 may track motion of the diaphragm and the surroundings and output a wave motion form at the interface between the lung and the liver as motion information (NAV data). The motion information, such as a navigation echo, may comprise an additional RF pulse signal and gradient added to different kinds of pulse sequences to monitor the target region using MR images. The navigation echo may be used in free breathing MRI in a free breathing state, such as cardiac MR imaging. The output motion information is transmitted to the k-space data processing unit 600 of the image generation unit 500.

As shown in FIG. 14, the magnetic resonance imaging apparatus may further include a controller 300 that generates a control signal to control operation of the data collection unit, i.e. unit 200. The controller 300 may include a static magnetic field controller 310 to control the static magnetic field coil unit 210, a gradient magnetic field controller 320 to control the gradient magnetic field coil unit 220, and an RF coil controller 330 to control the RF coil unit 230. The static magnetic field controller 310 of the controller 300 generates a control signal according to user instruction or command input through a manipulation unit i, such as an external workstation w, or prestored setting and transmits the control signal to a static magnetic field coil application unit 311.

Upon receiving the control signal, the static magnetic field coil application unit 311 applies current to the static magnetic field coil unit 210 such that the static magnetic field coil unit 210 and the gradient magnetic field coil unit 220 generate a static magnetic field. In the same manner, the gradient magnetic field controller 320 and the RF coil controller 330 generate a plurality of control signals according to user instruction or command or prestored setting and transmit the generated control signals to a gradient magnetic field coil application unit 321 and an RF coil application unit 331 such that the gradient magnetic field coil unit 220 and the RF coil unit 230 generate a gradient magnetic field or an electromagnetic wave for the object ob or the target region in the object ob. In addition, the controller 300 may further include a navigator controller 340 to control operation of the navigator 400 by generating a control signal to start or stop operation of the navigator 400 and transmits the generated control signal to the navigator 400. The magnetic resonance imaging apparatus may further include an amplifier 920 to amplify an analog magnetic resonance signal output from the RF coil unit 230. In addition, the magnetic resonance imaging apparatus may further include an A/D converter 930 to convert an analog signal output from the amplifier 920 into a digital signal. The digitized magnetic resonance signal is transmitted to the image generation unit 500.

The image generation unit 500 receives the digitized magnetic resonance signal output from the A/D converter 930 and motion information (NAV data) output from the navigator 400, determines a k-space data array using the received magnetic resonance signal and motion information, and converts the determined k-space data to generate a magnetic resonance image. Specifically, as shown in FIG. 14, the image generation unit 500 may include a k-space data processing unit 600 to generate a k-space, a Fourier transform unit 510 to perform Fourier transform to the k-space, and an image post-processing unit 520 to perform post-processing of the Fourier-transformed magnetic resonance image.

Figure 18:
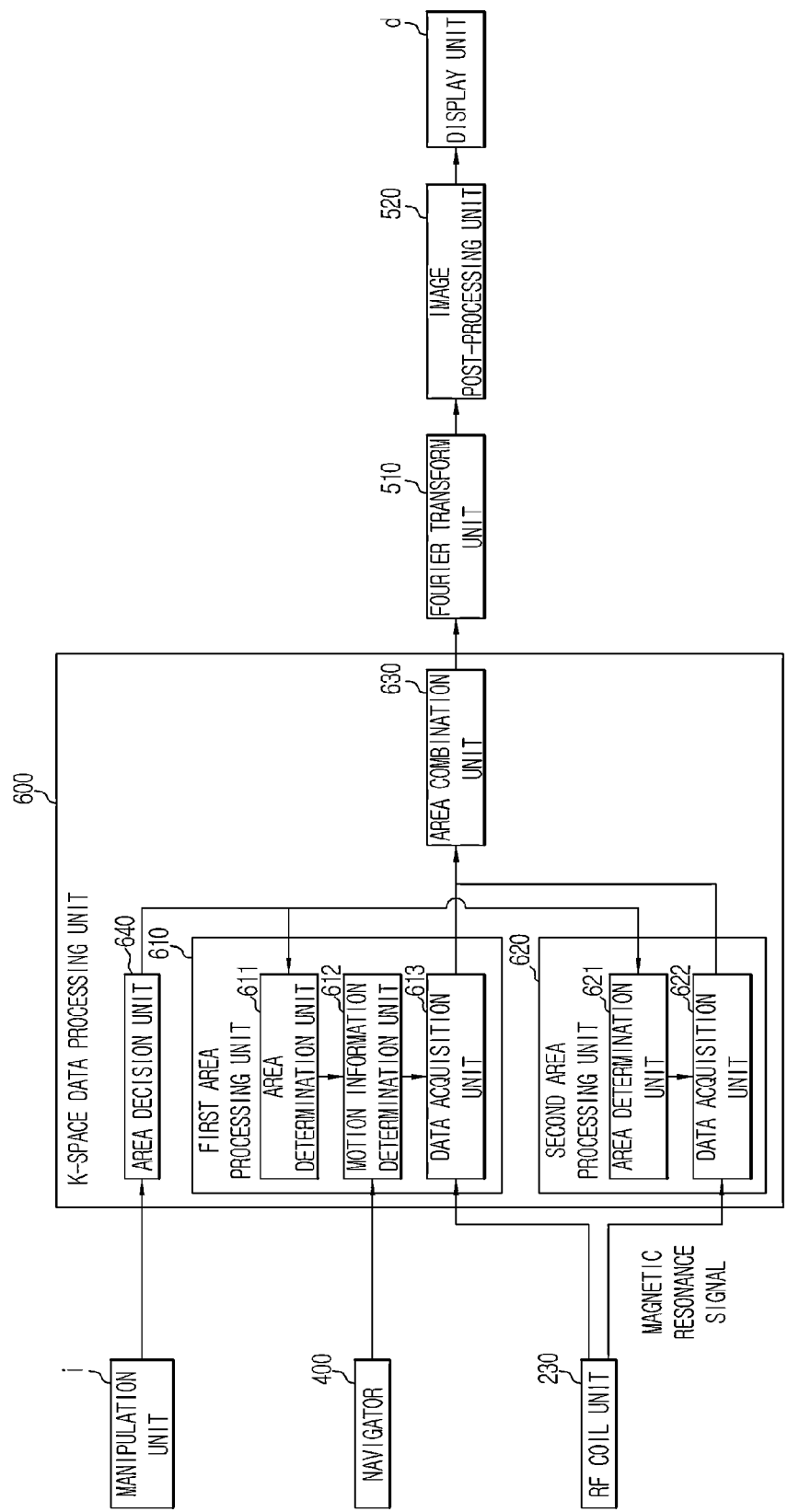
FIG. 18 shows a k-space data processing unit of the magnetic resonance imaging apparatus according to invention principles.

FIG. 18 shows the k-space data processing unit 600 of the magnetic resonance imaging apparatus including a first area processing unit 610, a second area processing unit 620, and an area combination unit 630. The first area processing unit 610 acquires k-space data of a central area of the k-space from a magnetic resonance signal. Referring back to FIG. 7, for the magnetic resonance imaging apparatus, a signal of each of the raw data has a signal of the maximum amplitude at the central area of the k-space. When a dephased proton is magnetized again, a magnetic resonance signal of the maximum amplitude is output. When the proton is dephased again, the amplitude is gradually decreased. As a result, the magnetic resonance signal has a signal of the maximum amplitude at a column located at the center of the data space as shown in FIG. 7. In addition, since a signal of the row located at the center is acquired without dephasing due to the gradient magnetic field Gy in the y-axis direction, the amplitude is higher than those of signals at the other rows. Amplitudes of signals at the other rows are lower than that of the row located at the center due to the gradient magnetic field Gy in the y-axis direction. As a result, the magnetic resonance signal located at the center has the maximum amplitude and signal to noise ratio (SNR). Consequently, the strongest signal is present at the central area of the k-space. In addition, signals at areas other than the central area are relatively weak. The first area processing unit 610 collects signals sg3 to sg5 (FIG. 7) at the central area at which the strongest signal is present to acquire k-space data.

The first area processing unit 610 may acquire k-space data of the central area of the k-space from the input magnetic resonance signal where motion information output from the navigator 400 is within a predetermined range, i.e. a k-space data collection range. To this end, as shown in FIG. 18, the first area processing unit 610 may include an area determination unit 611, a motion information determination unit 612, and a data acquisition unit 613. As shown in FIGS. 14 and 18, the area determination unit 611 of the first area processing unit 610 determines whether the magnetic resonance signal received from the RF coil unit 230 is a magnetic resonance signal for the central area of the k-space. Upon determining that the magnetic resonance signal received from the RF coil unit 230 is a magnetic resonance signal for the central area of the k-space, the motion information determination unit 612 of the first area processing unit 610 determines whether to acquire k-space data based on the respiratory motion information, received from the navigator 400.

For example, as shown in FIG. 8, the motion information determination unit 612 may compare the input motion information signals NAV1 and NAV2 with the k-space data acquisition range NAV to determine whether the motion information signals NAV1 and NAV2 are within the k-space data acquisition range NAV and generate a determination result signal. In this case, the motion information determination unit 612 may select (gate) a signal having an amplitude within a limited range from the motion information using a gating window to sort only the motion information within the -space data acquisition range and generate a determination result signal based on the sorted motion information. The data acquisition unit 613 collects k-space data for the central area of the k-space. The data acquisition unit 613 may determine whether to collect k-space data for the central area of the k-space according to the determination result of the motion information determination unit 612.

When the motion information determination unit 612 determines that the motion information is within a predetermined data acquisition range, the data acquisition unit 613 extracts and stores a magnetic resonance signal corresponding to the central area of the k-space in acquiring k-space data for the central area of the k-space. When the motion information determination unit 612 determines that the motion information deviates from the predetermined data acquisition range, the data acquisition unit 613 does not extract a magnetic resonance signal. As a result, k-space data for the central area of the k-space are not collected. For example, respiration motion is tracked by the navigator 400 and a k-space data acquisition range is defined as 7 mm, the data acquisition unit 613 acquires k-space data for the central area of the k-space when the motion range shown in FIG. 5 is less than 7 mm and does not collect k-space data when the motion range shown in FIG. 5 is greater than 7 mm.

The second area processing unit 620 collects k-space data for the area other than the central area of the k-space. Referring back to FIG. 7, for the magnetic resonance imaging apparatus, the magnetic resonance signal has the maximum amplitude at the central area of the k-space and signals of areas other than the central area are relatively weak. The second area processing unit 620 collects signals sg1, sg2, sg6, and sg7 of the other areas at which the signal are weak. As shown in FIG. 18, the second area processing unit 620 may include an area determination unit 621 and a data acquisition unit 622. The area determination unit 621 determines whether the magnetic resonance image received from the data collection unit 10 corresponds to the area other than the central area of the k-space and if so, the second area processing unit 620 collects the magnetic resonance image signal to collect k-space data for the area other than the central area of the k-space. Unlike the first area processing unit 610, the second area processing unit 620 does not determine whether additional motion information is within the k-space data acquisition range.

The area combination unit 630 combines the k-space data for the central area of the k-space acquired by the first area processing unit 610 and the k-space data for the area other than the central area of the k-space acquired by the second area processing unit 620 to form a k-space. As a result, a k-space K as shown in FIGS. 10 and 11 is formed. The central area K2 of the k-space is filled with the k-space data acquired by the first area processing unit 610 and the other areas K1 and K3 of the k-space is filled with the k-space data acquired by the second area processing unit 620.

As shown in FIG. 14, the generated k-space is transmitted to the Fourier transform unit 510 which converts the k-space into a magnetic resonance image using Fourier transform. The Fourier-transformed magnetic resonance image may be transmitted to the image post-processing unit 520 as needed. The image post-processing unit 520 adjusts brightness, sharpness, or contrast of the entirety or a portion of the Fourier-transformed magnetic resonance image to correct the Fourier-transformed magnetic resonance image. The image post-processing unit 520 may generate a three-dimensional stereoscopic image using a plurality of magnetic resonance images. The magnetic resonance image, which is generated or corrected as needed, is displayed outside through the display unit d installed at the workstation w.

The data processing unit 600 may further include an area decision unit 640 (FIG. 18). The area decision unit 640 may receive information regarding areas to be processed by the first area processing unit 610 and the second area processing unit 620 from a manipulation unit i of an additional external workstation or an additional memory device. As a result, a user may select and adjust the size of the central area of the k-space, from which k-space data is acquired in response to motion information. As needed, the number or position of areas of the k-space may also be adjusted.

Figure 19:
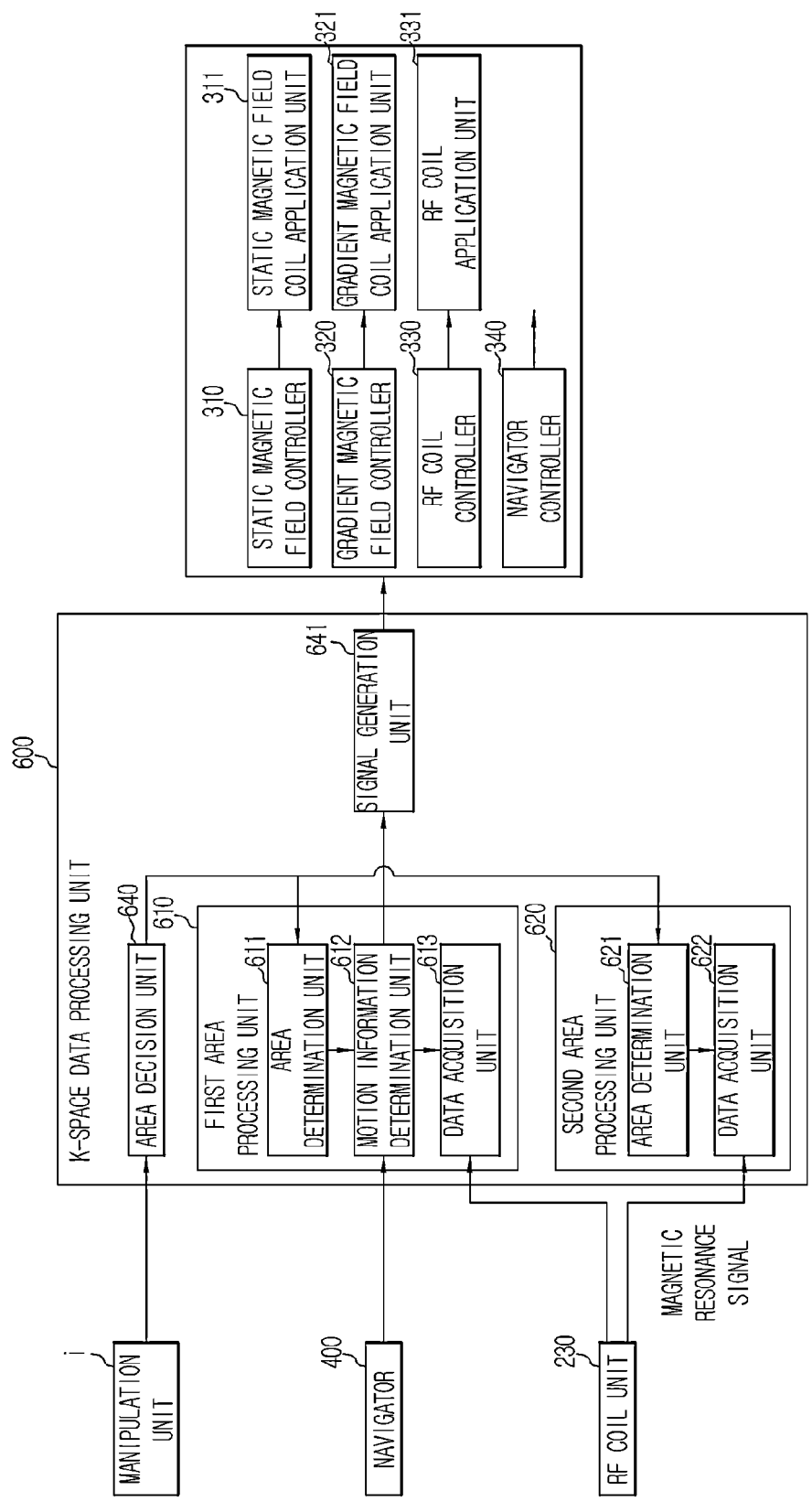
FIG. 19 shows another k-space data processing unit of the magnetic resonance imaging apparatus according to invention principles.

FIG. 19 shows the k-space data processing unit of the magnetic resonance imaging apparatus. A motion information determination unit 612 of a first area processing unit 610 transmits a command corresponding to a determination result to a signal generation unit 641. The signal generation unit 641 generates a control signal to control the controller 300 according to the received command and transmits the generated control signal to the controller 300. As described previously, the motion information determination unit 612 compares the motion information received from the navigator 400 with the k-space data acquisition range. Upon determining that the motion information deviates from the k-space data acquisition range, the motion information determination unit 612 generates a command based on the determination result and transmits the generated command to the signal generation unit 641. For example, referring back to FIG. 8, the motion information determination unit 612 compares input motion information signals NAV1 and NAV2 with a k-space data acquisition range NAV defined by a user. Where the motion information deviates from the k-space data acquisition range as shown in the right side NB of FIG. 8 (NAV2), the motion information determination unit 612 generates a control signal not to acquire k-space data and transmits the control signal to a data acquisition unit 613. The motion information determination unit 612 generates a command to generate a control signal for the controller 300 and transmits the command to the signal generation unit 641.

The signal generation unit 641 generates a control signal for the controller 300 according to the determination result of the motion information determination unit 612, i.e. the determination result that the motion information deviates from the k-space data acquisition range. The generated control signal is transmitted to the controller 300. The controller 300 receives the control signal from the signal generation unit 641 and controls operation of the data collection unit 200 according to the received control signal. Specifically, the static magnetic field controller 310, the gradient magnetic field controller 320, and the RF coil controller 330 of the controller 300 may generate control signals for operation of the static magnetic field coil unit 210, the gradient magnetic field coil unit 220, and the RF coil unit 230 according to the received control signal and transmit the generated control signals to the static magnetic field coil unit 210, the gradient magnetic field coil unit 220, and the RF coil unit 230. The static magnetic field coil unit 210 and the gradient magnetic field coil unit 220 apply a magnetic field to the object ob according to the control signals such that the object ob, specifically the target region in the object ob, is exposed to the magnetic field. The RF coil unit 230 applies an electromagnetic wave to the target region in the object ob to re-collect a magnetic resonance signal from the target region inside or outside the object ob.

Where motion information received from the navigator 400 is not within the k-space data acquisition range and thus the first area processing unit 610 does not acquire k-space data, the data collection unit 200 may re-collect a magnetic resonance signal from the target region of the object ob. The re-collected magnetic resonance signal is transmitted to the image generation unit 500, specifically the k-space data processing unit 600, via the amplifier 920 and the A/D converter 930. The k-space data processing unit 600 may repeat a process of collecting or not collecting k-space data from the re-collected magnetic resonance signal according to the motion signal received from the navigator 400 and the areas of the k-space.

Figure 20:
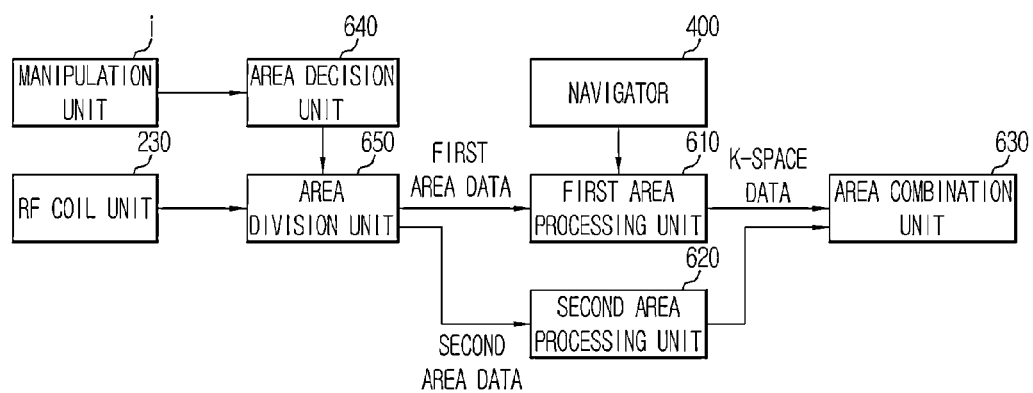
FIG. 20 shows a k-space data processing unit of the magnetic resonance imaging apparatus according to invention principles.

FIG. 20 shows another k-space data processing unit of the magnetic resonance imaging apparatus including an area division unit 650. The area division unit 650 may receive information regarding the determined area of the k-space, e.g. the central area of the k-space, from the area decision unit 640, identify and sort the magnetic resonance signals from the RF coil unit 230 according to the information of the received area of the k-space, and distribute the magnetic resonance signals to the first area processing unit 610 or the second area processing unit 620. According to embodiments, an amplifier 920 and an A/D converter 930 may be further provided between the RF coil unit 230 and the area division unit 650.

Specifically, the area decision unit 640 may determine areas of the k-space to be processed by the first area processing unit 610 and the second area processing unit 620 according to user command input through the manipulation unit i or pre-stored setting information. For example, the area decision unit 640 may determine the central area of the k-space as a first area and the area other than the central area as a second area. When the area of the k-space is determined by the area decision unit 640 as described above, the area division unit 650 may sort a magnetic resonance signal corresponding to the first area, e.g. the central area of the k-space, i.e. first area data, and a magnetic resonance signal corresponding to the second area, e.g. the area other than the central area of the k-space, i.e. second area data, from the magnetic resonance signals input from the RF coil unit 230 according to the determined area of the k-space.

The area division unit 650 transmits the first area data to the first area processing unit 610 and transmits the second area data to the second area processing unit 620. The first area data and the second area data may be sorted at the same time or at different times. Alternatively, the first area data and the second area data may be sequentially sorted. For example, the area decision unit 640 may determine whether the magnetic resonance signal is a magnetic resonance signal corresponding to a portion of the k-space which is pre-determined, e.g. the central area of the k-space, and, upon determining that the magnetic resonance signal is a magnetic resonance signal corresponding to a portion of the k-space which is pre-determined, transmits the magnetic resonance signal to the first area processing unit 610. Upon determining that the magnetic resonance signal does not correspond to a portion of the k-space which is pre-determined, the area decision unit 640 may determine whether the magnetic resonance signal corresponds to another portion of the k-space which is pre-determined, and, upon determining that the magnetic resonance signal corresponds to another portion of the k-space which is pre-determined, transmit the magnetic resonance signal to the second area processing unit 620. The area division unit 650 may determine whether the magnetic resonance signal corresponds to a further portion of the k-space which is pre-determined and transmits the magnetic resonance signal to a third area processing unit. The area division unit 650 may be omitted in an embodiment, for example, where the first area data and the second area data are already divided and are input to the k-space data processing unit 600.

Figure 21:
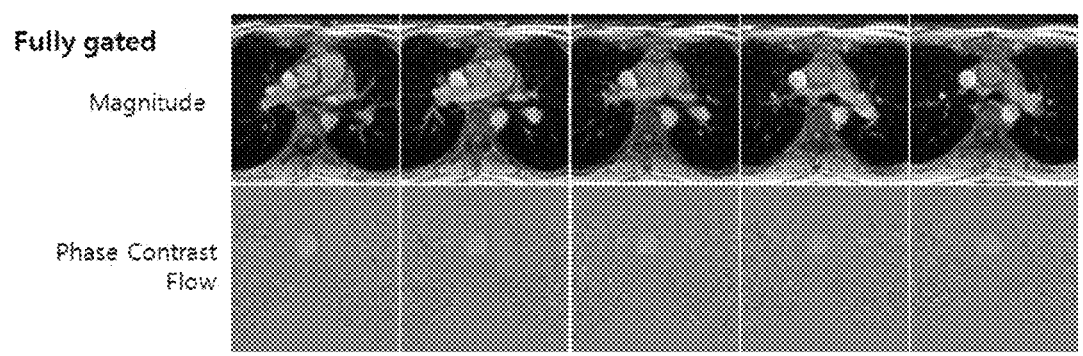
FIG. 21 and FIG. 22 show MR images generated by the system according to invention principles.
Figure 22:
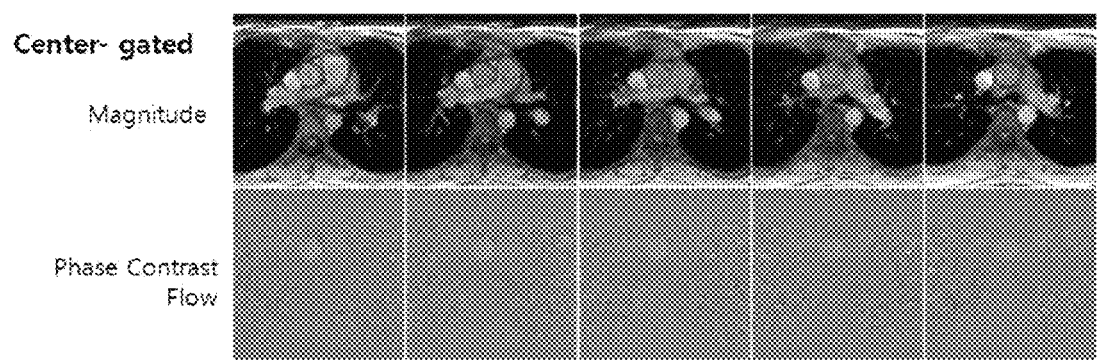

FIGS. 21 and 22 show magnetic resonance images generated by the image generation unit 500. The upper row of images are magnitude and the lower row of images are phase contrast flow images. A magnetic resonance image acquired using a full gating method to collect k-space data where motion information regarding the entire area of the k-space is within a predetermined range is shown in FIG. 22. As shown in FIGS. 21 and 22, there is no great difference between the two images, however, acquisition time of the k-space is advantageously reduced.

For example, acquisition time of the k-space using a full gating method is about 19 minutes 35 seconds±5 minutes 2 seconds. Whereas, the acquisition time of the k-space according to the magnetic resonance imaging apparatus is about 13 minutes 19 seconds±3 minutes 2 seconds. That is, the acquisition time of the k-space using the full gating method is reduced by about 30%. Consequently, an image of substantially the same quality may be acquired within reduced time, and navigator gating efficiency is improved. The magnetic resonance imaging is usable by different kinds of magnetic resonance imaging using a navigator echo such as cardiac magnetic resonance imaging. In addition, the magnetic resonance imaging apparatus as described above may also be applied to various kinds of magnetic resonance imaging apparatuses to perform cardiac flow imaging, coronary MO angiography, cardiac perfusion imaging, and cardiac late gadolinium enhancement (LGE) imaging.

Figure 23:
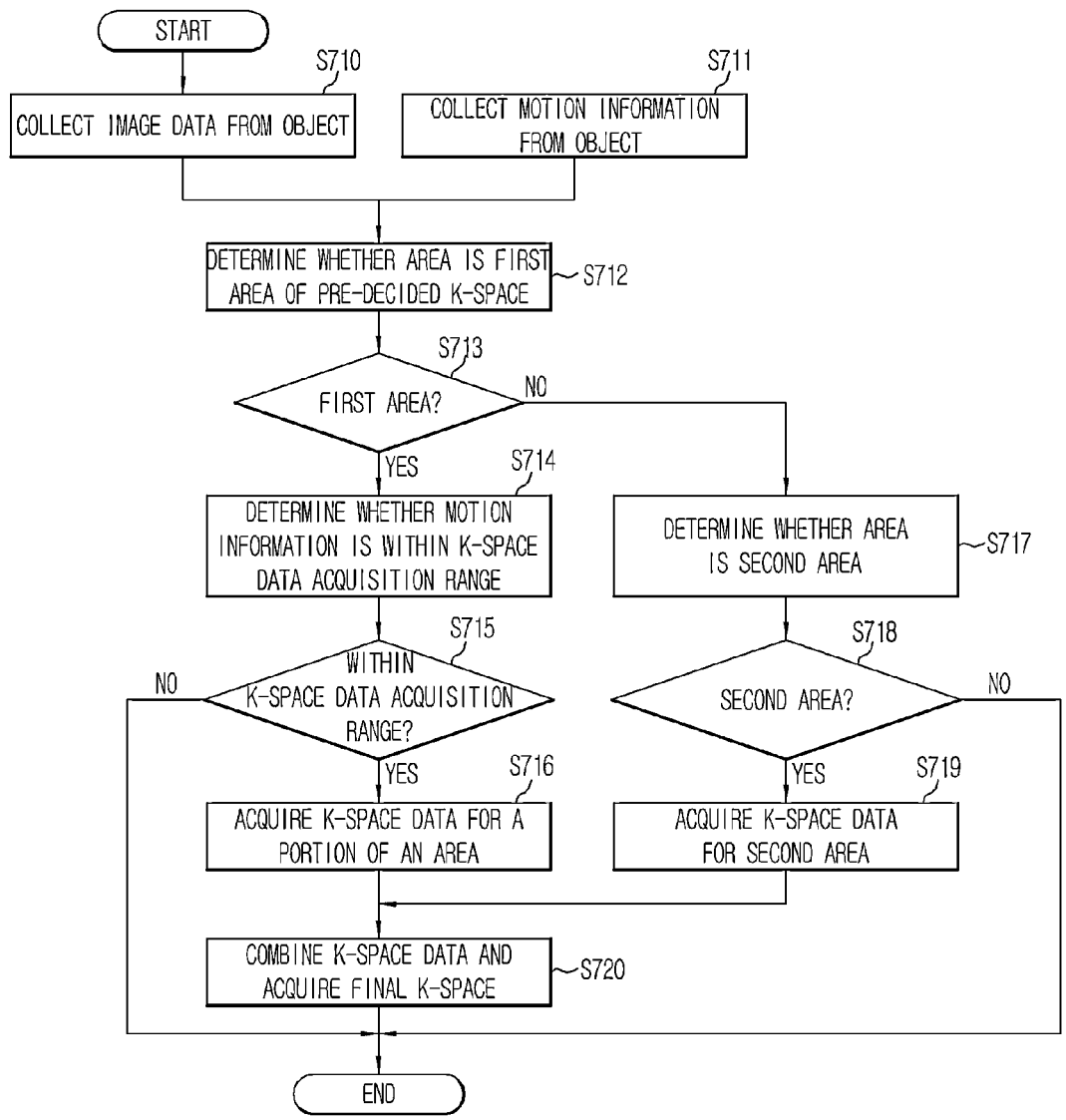
FIG. 23 shows a k-space generation method according to invention principles.

A k-space generation method and a control method of the magnetic resonance imaging apparatus is described with reference to FIGS. 23 to 27. FIG. 23 shows a k-space generation method. As shown in FIG. 23, in order to collect k-space data from raw data and to generate a k-space using the collected k-space data, raw image data are collected from a target region (S710) and motion information is collected from a motion region at the same time or at different times (S711). In a case in which the collected raw image data for the target region are raw image data corresponding to a first area of the k-space (S713), it is determined whether the motion information collected from the motion region is within a k-space data acquisition range (S714). The k-space data acquisition range may be selected by a user or pre-determined and stored. In this case, as shown in FIG. 23, it may be determined whether the collected raw image data for the target region is image data corresponding to a portion of the k-space which is pre-determined, i.e. a first area of the k-space, before the space data acquisition range is determined (S712).

Upon determining that the motion information collected from the motion region is within the k-space data acquisition range (S715), the raw image data are stored to acquire k-space data to fill the first area of the k-space (S716). Upon determining at Operation S713 that the collected raw image data is not image data corresponding to the first area of the k-space but are image data corresponding to a second area of the k-space (S718), the raw image data corresponding to the second area of the k-space is stored to acquire k-space data for the second area of the k-space (S719). In operation S713 if the collected raw image data is not image data corresponding to the first area of the k-space, it may be determined whether the collected raw image data are image data corresponding to the second area of the k-space (S717). When the k-space data for the first area and the second area of the k-space are collected, the k-space data for the first area of the k-space and the space data for the second area of the k-space are combined to acquire a final k-space (S720).

Figure 24:
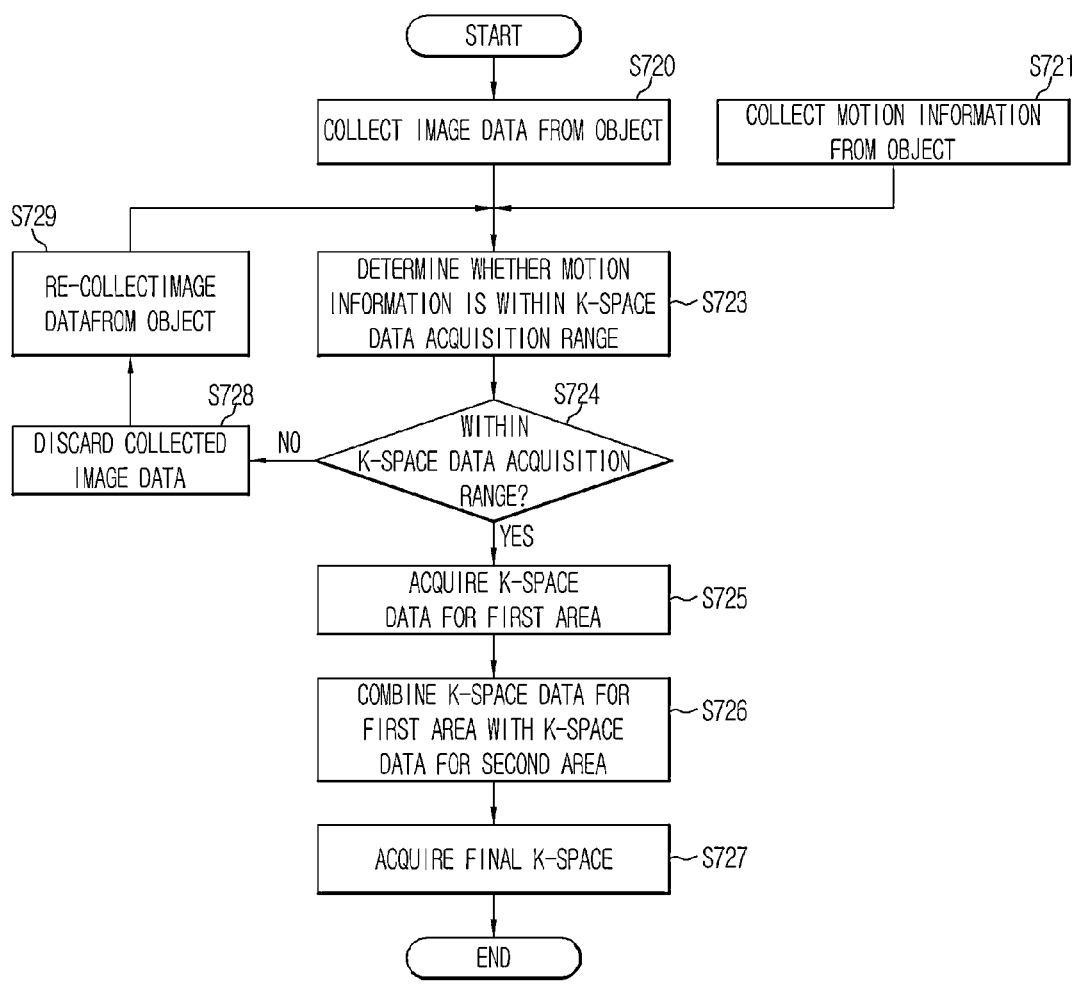
FIG. 24 shows another k-space generation method according to invention principles.

FIG. 24 another k-space generation method where motion information deviates from a k-space data acquisition range. Image data and motion information are collected from a target region and a motion region, respectively (S720 and S721) and it is determined whether the motion information is within a k-space data acquisition range (S723). Upon determining that the motion information is within the k-space data acquisition range, k-space data for a first area are stored and acquired as described above and the k-space data for the first area and k-space data for a second area acquired using the above method are combined to acquire a final k-space (S723 to S727). Upon determining that the motion information is not within the k-space data acquisition range, i.e. the motion information deviates from the k-space data acquisition range, k-space data are not acquired from the image data. In this case, the collected raw image data may be discarded (S728). Subsequently, raw image data for the target region are re-collected from the target region (S729). In this case, at Operation S729, raw image data for the target region may be re-collected using a method identical or similar to the image data collection method (S720) as described above. Alternatively, raw image data for the target region may be re-collected using a method different from the image data collection method.

Figure 25:
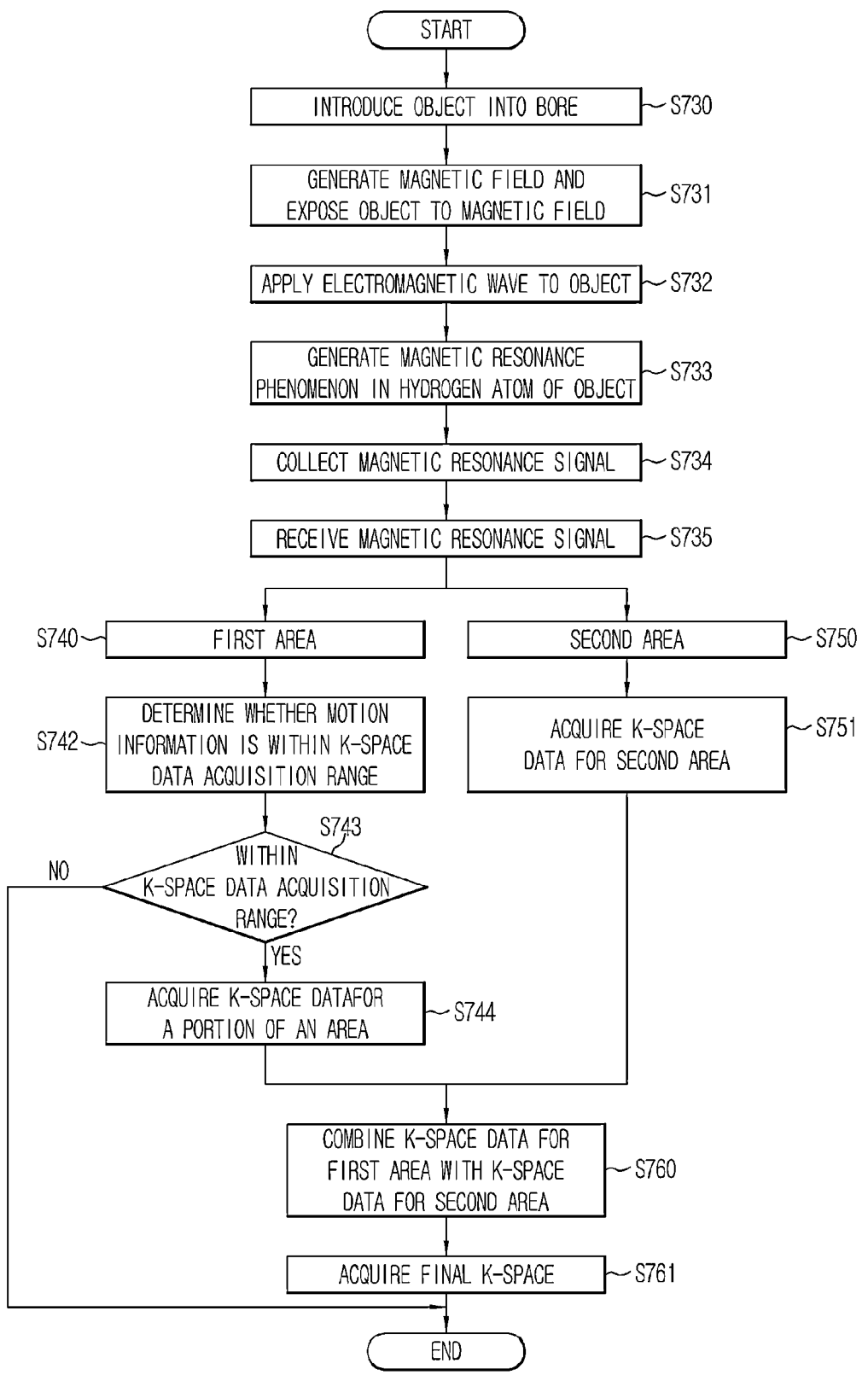
FIG. 25 shows a control method of the magnetic resonance imaging apparatus according to invention principles.

FIG. 25 shows a control method of the magnetic resonance imaging system. An object ob, e.g. a human body, is introduced into the bore of the magnetic resonance imaging apparatus via a transfer table (S730). The static magnetic field coil unit 210 and the gradient magnetic field coil unit 220 of the magnetic resonance imaging apparatus generate and apply magnetic fields to the object ob such that the object is exposed to the magnetic fields (S731). When the RF coil unit 230 applies an electromagnetic wave to a target region of the object ob exposed to the magnetic fields (S732), a magnetic resonance excitation is generated in a hydrogen atom of the target region in the object ob (S733). The RF coil unit 230 collects magnetic resonance signals from the target region of the object (S734).

The image generation unit 500 of the magnetic resonance imaging apparatus receives the magnetic resonance signals from the RF coil unit 230 (S735). Motion information regarding the motion region of the human body, e.g. motion information regarding the chest performing respiration, is collected by the navigator 400. The image generation unit 500 determines whether, for a magnetic resonance signal corresponding to a first area of a k-space, e.g. a central area of the k-space, among the received magnetic resonance signals (S740), the motion information regarding the motion region of the object ob acquired from the navigator 400 is within a k-space data acquisition range (S742). Upon determining that the acquired motion information is within the k-space data acquisition range (S743), the image generation unit 500 stores the magnetic resonance signal to acquire k-space data for the first area of the k-space (S744). For a magnetic resonance signal corresponding to a second area of the k-space, e.g. an area other than the central area of the k-space, among the received magnetic resonance signals (S750), the image generation unit 500 stores the magnetic resonance signal without consideration of the motion information to acquire k-space data for the second area of the k-space (S751). When the k-space data for the first area of the k-space and the space data for the second area of the k-space are collected, the k-space data for the first area of the k-space and the space data for the second area of the k-space are combined (S760) to acquire a final k-space (S761). The image generation unit 500 performs Fourier transform to the acquired k-space to generate a magnetic resonance image and transmits the generated magnetic resonance image to the display unit such that a user may view the magnetic resonance image.

Figure 26:
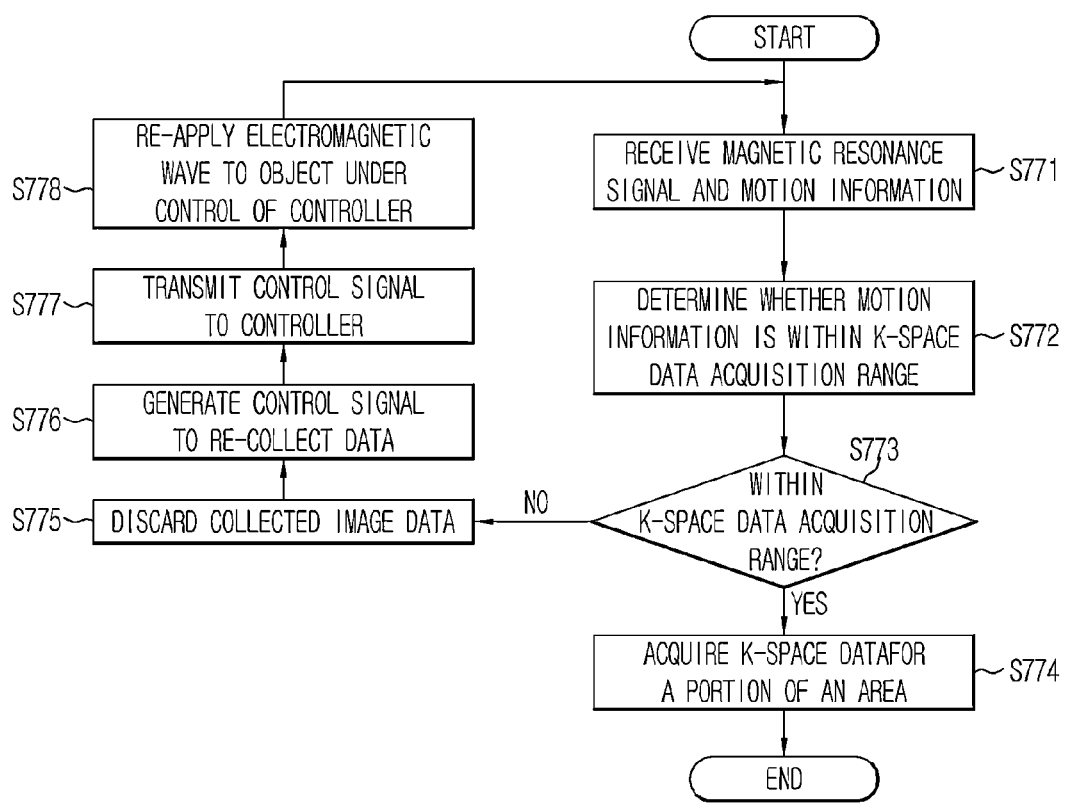
FIG. 26 shows a control method of the magnetic resonance imaging apparatus according to invention principles.

FIG. 26 another control method of the magnetic resonance imaging system Where motion information acquired from the navigator 400 is not within the k-space data acquisition range. In response to k-space data being acquired from a magnetic resonance signal corresponding to the first area of the k-space, among the received magnetic resonance signals (S771 to S773), the magnetic resonance signal may not be stored but may be discarded. As a result, k-space data for the first area of the k-space may not be acquired (S775).

In this case, the image generation unit 500 generates a control signal to re-collect data (S776) and transmits the control signal to the controller 300 (S777). The controller further generates a control signal to control the RF coil unit 230 to re-apply an electromagnetic wave to the target region of the object. The RF coil unit 230 applies an electromagnetic wave to the target region in the object ob exposed to the magnetic field to re-receive and re-collect a magnetic resonance signal (S778). Where motion information acquired from the navigator 400 is within the k-space data acquisition range, the magnetic resonance signal is stored to acquire k-space data (S774).

Figure 27:
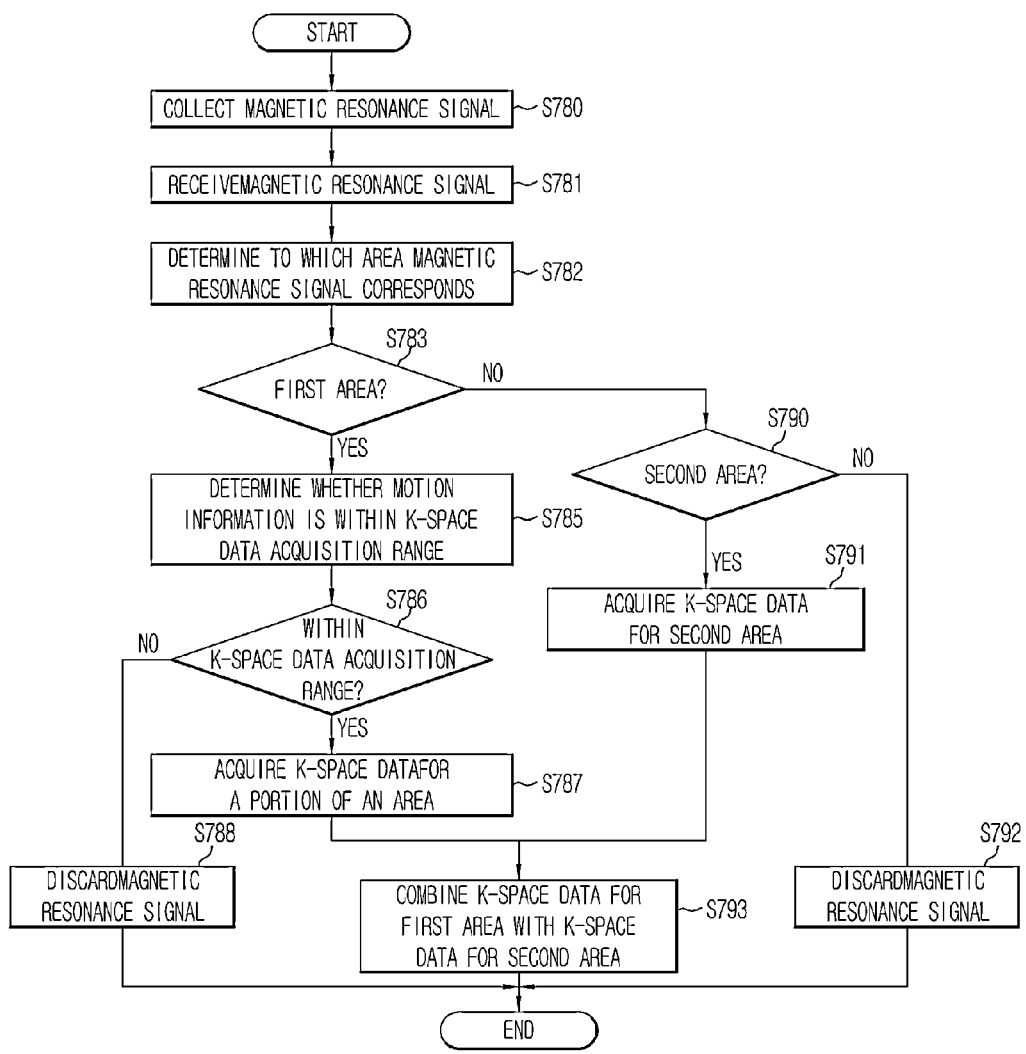
FIG. 27 shows a control method of the magnetic resonance imaging apparatus according to invention principles.

FIG. 27 shows a further control method of the magnetic resonance imaging system. The data collection unit 220 collects a plurality of magnetic resonance signals (S780) and transmits the collected magnetic resonance signals to the image generation unit. The image generation unit may receive the magnetic resonance signals (S781) and determines to which areas of the k-space the received the magnetic resonance signals correspond (S782). This determination may be performed by the area division unit 650. In response to determining that the magnetic resonance signal is a magnetic resonance signal corresponding to the first area of the k-space, e.g. the central area of the k-space (S783), it is determined whether additionally collected motion information is within a k-space data acquisition range (S785). Upon determining that the collected motion information is within the k-space data acquisition range (S786), a magnetic resonance image is extracted and stored in acquiring k-space data from the first area of the k-space (S787). Upon determining that the collected motion information is not within the k-space data acquisition range (S786), the magnetic resonance image is not stored but discarded (S788).

Upon determining that the magnetic resonance signal is not a magnetic resonance signal corresponding to the first area of the k-space, it may be determined whether the magnetic resonance signal is a magnetic resonance signal corresponding to the second area of the k-space (S790). Upon determining that the magnetic resonance signal is a magnetic resonance signal corresponding to the second area of the k-space, the magnetic resonance signal is stored without additional conditions in acquiring k-space data from the second area of the k-space (S791). Upon determining that the magnetic resonance signal is not a magnetic resonance signal corresponding to the second area of the k-space, the collected magnetic resonance signal is discarded (S792). In response to collection of the k-space data for the first area and the second area, the k-space data for the first area of the k-space and the space data for the second area of the k-space are combined to generate a k-space (S793). As a result, a final k-space is acquired.

The system improves diagnosis of lesions of a human body using a magnetic resonance image, therefore, reliability of diagnosis is improved and the rate of misdiagnosis is reduced. Although a few embodiments of the present invention have been shown and described, it would be appreciated by those skilled in the art that changes may be made in these embodiments without departing from the principles and spirit of the invention, the scope of which is defined in the claims and their equivalents.

The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C.

112, sixth paragraph, unless the element is expressly recited using the phrase "means for."

What is claimed is:

1. A magnetic resonance (MR) image processing system comprising:
   a data collection unit to acquire image data from a target region of an object;
   a navigator unit to acquire a motion signal indicating motion comprising motion of at least a portion of an object; and
   a processor configured to determine a first portion and a second portion of a k-space based on a user's command or a predetermined configuration, and to derive k-space data for a k-space data array from the acquired image data, by
      acquiring k-space data for the first portion of the k-space from the acquired image data in response to the motion signal indicating motion is within a predetermined range and
      acquiring k-space data for the second portion of the k-space from the acquired image data irrespective of the predetermined range.

2. The image processing system according to claim 1, wherein, in response to the motion signal indicating motion is outside the predetermined range, the processor stops deriving the k-space data for a portion of the k-space from the image data.

3. The image processing system according to claim 2, wherein, in response to the processor stopping acquiring the k-space data, the processor re-acquires image data for deriving the k-space data.

4. The image processing system according to claim 1, wherein the predetermined range corresponds to a motion range of the at least a portion of the object and the object comprises patient anatomy.

5. The image processing system according to claim 1, wherein the motion of at least a portion of the object is repetitive motion and the navigator unit tracks the repetitive motion to derive an upper limit and a lower limit of the repetitive motion.

6. The image processing system according to claim 1, wherein a portion of the k-space is a central area of the k-space.

7. A magnetic resonance (MR) image processing system k-space generation method comprising:
   acquiring image data from a target region of an object;
   acquiring a motion signal indicating motion of at least a portion of the object; and
   deriving k-space data for a k-space data array from the acquired image data by,
      determining whether the motion is within a k-space data acquisition range,
      determining a first portion and a second portion of the k-space based on user's command or a predetermined configuration,
      receiving the motion signal and input from a radio frequency (RF) coil unit and only acquiring the k-space data for the first portion of the k-space from the image data if the motion signal indication motion is within a predetermined range; and
      acquiring the k-space data for the second portion of the k-space from the image data irrespective of the k-space data acquisition range.

8. The k-space generation method according to claim 7, further comprising, excluding the k-space data for the portion of the k-space in response to the motion of at least a portion of the object deviating from the predetermined range.

9. The k-space generation method according to claim 8, further comprising re-collecting image data for the object in response to the motion deviating from the predetermined range.

10. The k-space generation method according to claim 7, wherein the motion of at least a portion of the object concerns a motion range of the object.

11. The k-space generation method according to claim 7, wherein the motion of at least a portion of the object is repetitive motion and the acquiring the image data comprises tracking the repetitive motion of the object to acquire an upper limit and a lower limit of the repetitive motion.

12. The k-space generation method according to claim 7, wherein the first portion of the k-space is a central area of the k-space.

13. A magnetic resonance imaging system comprising:
   an imaging unit to generate a static magnetic field and a gradient magnetic field to apply to an object, to generate an electromagnetic wave to apply to a target region of the object, and to acquire a magnetic resonance signal generated from the target region in the object in response to application of the electromagnetic wave to acquire image data;
   a navigator unit to acquire a motion signal indicating motion comprising motion of at least a portion of an object; and
   an image generation unit configured to determine a first portion and a second portion of a k-space based on user's command or a predetermined configuration, and to derive k-space data for a k-space data array from the acquired magnetic resonance signal and to generate a magnetic resonance image based on the magnetic resonance signal, by
      acquiring k-space data for the first portion of the k-space from the acquired image data in response to the motion signal indicating motion is within a predetermined range and
      acquiring k-space data for the second portion of the k-space from the acquired image data irrespective of the predetermined range.

14. The magnetic resonance imaging system according to claim 13, wherein, in response to the motion of at least a portion of an object deviating from the predetermined range, the image generation unit stops acquiring the k-space data from the magnetic resonance signal.

15. The magnetic resonance imaging system according to claim 14, wherein, in response to stopping acquiring the k-space data from the magnetic resonance signal, the imaging generation unit re-acquires a magnetic resonance signal.

16. The magnetic resonance imaging system according to claim 13, wherein the motion signal indicates a motion range of the object.

17. The magnetic resonance imaging system according to claim 13, wherein the motion of the at least a portion of an object is repetitive motion and the navigator unit tracks the repetitive motion to derive an upper limit and a lower limit of the repetitive motion.

18. The magnetic resonance imaging system according to claim 13, wherein a portion of the k-space is a central area of the k-space and the object comprises patient anatomy.

19. The magnetic resonance imaging system according to claim 13, wherein the motion of the object is respiratory motion.

20. The magnetic resonance imaging system according to claim 13, wherein the navigator unit comprises a respiratory navigator.

21. The magnetic resonance imaging system according to claim 13, wherein the image generation unit determines whether the motion of at least a portion of an object is within a k-space data acquisition range using a gating window.

22. A control method of a magnetic resonance imaging system comprising:
  generating a static magnetic field and a gradient magnetic field to apply to an object;
  applying a radio frequency (RF) electromagnetic wave to a target region of the object exposed to the static magnetic field and the gradient magnetic field, receiving a magnetic resonance signal generated from the target region of the object in response to the radio frequency (RF) electromagnetic wave, and tracking motion of at least a portion of the object and providing a motion signal indicating motion comprising motion of at least a portion of the object;
  determining a first portion and a second portion of a k-space based on user's command or a predetermined configuration;
  receiving the motion signal and the magnetic resonance signal;
  deriving the first portion of a k-space data from the magnetic resonance signal only in response to the motion signal indicating motion being within a k-space data acquisition range; and
  deriving k-space data for the second portion of the k-space from the magnetic resonance signal irrespective of the k-space data acquisition range.

23. The control method according to claim 22, wherein the deriving the first portion of the k-space further comprises:
  in response to determining whether the magnetic resonance signal corresponds to the first portion of the k-space, determining whether the motion of at least a portion of the object is within the k-space data acquisition range; and
  in response to determining that the motion of at least a portion of the object is within the k-space data acquisition range, deriving k-space data for the first portion of the k-space from the magnetic resonance signal.

24. The control method according to claim 23, further comprising stopping acquiring the k-space data for a portion of the k-space in response to determining that the motion of at least a portion of the object deviates from the k-space data acquisition range.

25. The control method according to claim 24, further comprising re-applying an electromagnetic wave to the object exposed to the static magnetic field and the gradient magnetic field and re-receiving a magnetic resonance signal generated from the object in response to the motion of at least a portion of the object deviating from the k-space data acquisition range.

26. The control method according to claim 23, wherein the determining whether the magnetic resonance signal corresponds to the first portion of the k-space comprises determining whether the motion is within the k-space data acquisition range using a gating window.

27. The control method according to claim 22, deriving the second portion of the k-space comprises:
  determining whether the magnetic resonance signal corresponds to the second portion of the k-space; and
  upon determining that the magnetic resonance signal corresponds to the second portion of the k-space, acquiring k-space data for second portion of the k-space from the magnetic resonance signal.

28. The control method according to claim 22, wherein the motion of the object is respiratory motion.

29. The control method according to claim 22, wherein a portion of the k-space is a central area of the k-space.

30. A magnetic resonance (MR) image processing system comprising:
  a navigator unit to acquire a motion signal indicating motion of at least a portion of an object; and
  a processor configured to determine a first portion and a second portion of a k-space based on user's command or a predetermined configuration, and to derive a combined k-space data by
  acquiring k-space data for the first portion of the k-space in response to the motion signal indicating motion being within a predetermined range and
  acquiring k-space data for the second portion of the k-space irrespective of the predetermined range.

* * * * *